United States Patent
Balakrishnan et al.

(10) Patent No.: US 9,754,933 B2
(45) Date of Patent: Sep. 5, 2017

(54) LARGE AREA DIODE CO-INTEGRATED WITH VERTICAL FIELD-EFFECT-TRANSISTORS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/983,723

(22) Filed: Dec. 30, 2015

(65) Prior Publication Data

US 2017/0194318 A1 Jul. 6, 2017

(51) Int. Cl.
*H01L 29/78* (2006.01)
*H01L 29/94* (2006.01)
*H01L 27/06* (2006.01)
*H01L 21/8234* (2006.01)

(52) U.S. Cl.
CPC .. *H01L 27/0629* (2013.01); *H01L 21/823487* (2013.01)

(58) Field of Classification Search
CPC ............ H01L 29/7813; H01L 29/1095; H01L 29/7802; H01L 29/0696; H01L 29/0634; H01L 21/823487; H01L 27/0629
See application file for complete search history.

(56) References Cited

U.S. PATENT DOCUMENTS

| | | | |
|---|---|---|---|
| 6,449,186 B2 * | 9/2002 | Noble | G11C 11/412 365/154 |
| 2011/0012085 A1 * | 1/2011 | Deligianni | B82Y 10/00 257/9 |
| 2015/0200308 A1 * | 7/2015 | Karda | H01L 27/2454 257/329 |

OTHER PUBLICATIONS

U.S. Appl. No. 15/087,495, filed Mar. 31, 2016, entitled "Co-Fabrication of Vertical Diodes and Fin Field Effect Transistors on the Same Substrate.".

* cited by examiner

*Primary Examiner* — Dale E Page
*Assistant Examiner* — Long H Le
(74) *Attorney, Agent, or Firm* — Cantor Colburn LLP; Louis Percello

(57) ABSTRACT

An integrated circuit is provided having a semiconductor structure, the semiconductor structure including a vertical field-effect transistor; and a diode wherein the vertical field-effect transistor and the diode are co-integrated in the semiconductor structure.

12 Claims, 24 Drawing Sheets

US 9,754,933 B2

LARGE AREA DIODE CO-INTEGRATED WITH VERTICAL FIELD-EFFECT-TRANSISTORS

BACKGROUND

The present disclosure generally relates to the field of semiconductors, and more particularly relates to large area diodes co-integrated with vertical field-effect-transistors.

Vertical transistors are a promising option for technology scaling for 5 nm and beyond. Diodes are an important part of a technology offering, as they are used for analog circuits and electrostatic discharge applications. However, achieving co-integration of a large area diode in a vertical field-effect-transistor-based architecture has been challenging.

SUMMARY

In an embodiment of the invention, a method for making a semiconductor structure is provided that includes the steps of forming a structure including a substrate, a source contact layer on the substrate, a first spacer layer on the source contact layer, a replacement gate on the first spacer layer, a second spacer layer on the replacement gate, and an insulating layer on the second spacer layer; forming a first trench in a first region of the structure, the first trench extending from a top surface of the insulating layer down to a top surface of the source contact layer; epitaxially growing a first channel layer up from the top surface of the source contact layer, the first channel layer filling the first trench; forming a second trench in a second region of the structure, the second trench extending from the top surface of the insulating layer down to the top surface of the source contact layer; and epitaxially growing a second channel layer including a p- or n-type material up from the top surface of the source contact layer, the second channel layer filling the second trench, where the p- or n-type material has an opposite doping than the source contact layer to form a diode.

In an embodiment of the invention, a semiconductor structure is provided that includes a vertical field-effect transistor; and a diode wherein the vertical field-effect transistor and the diode are co-integrated in the semiconductor structure.

In another embodiment of the invention, an integrated circuit is provided that includes a semiconductor structure, the semiconductor structure including a vertical field-effect transistor; and a diode wherein the vertical field-effect transistor and the diode are co-integrated in the semiconductor structure.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
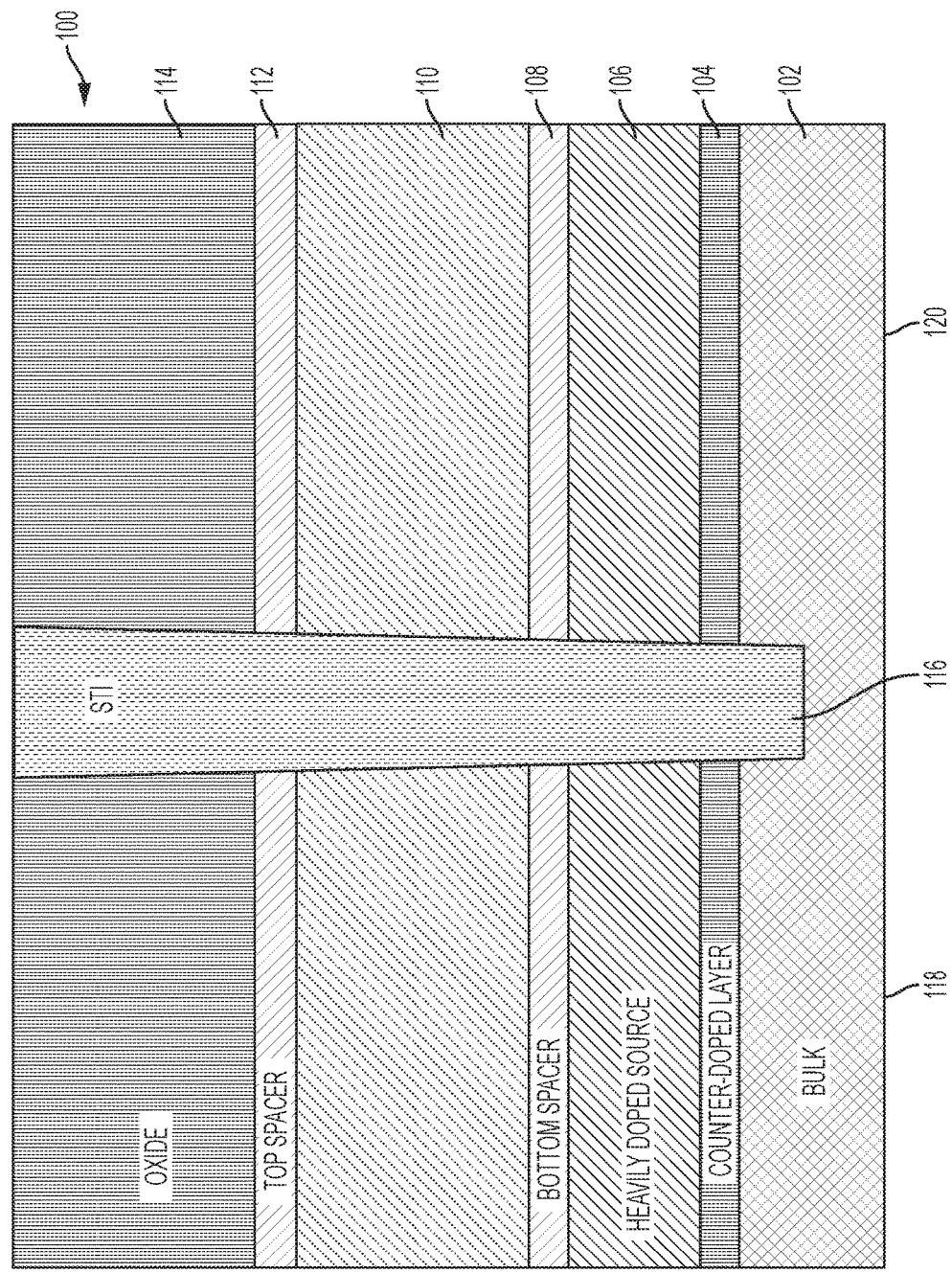
FIG. 1 is a cross-sectional view of an initial semiconductor structure according to one embodiment of the present disclosure.

As stated above, the present invention relates to the field of semiconductors, and more particularly relates to large area diodes co-integrated with vertical field-effect-transistors, which are now described in detail with accompanying figures. It is noted that like reference numerals refer to like elements across different embodiments.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-22 illustrate various processes for fabricating large area diodes co-integrated with vertical field-effect-transistors (FETs). FIG. 1 shows a partially fabricated semiconductor device 100 comprising a bulk substrate 102, a counter-doped layer 104, a source contact layer 106, a first (bottom) spacer layer 108, a replacement (dummy) gate 110, a second (top) spacer layer 112), and a top oxide layer 114. FIG. 1 also shows a shallow trench isolation (STI) 116 is formed through the top oxide layer 114, the second spacer 112, the replacement gate 110, the first spacer 108, the source layer 106, the counter-doped layer 104, and partially into the bulk substrate layer 102. The STI 120 partially separates the device 100 into a VT1 region 118 and VTN region 120.

The thickness of the substrate 102 can be, for example, from 3000 microns to 1,000 microns, although lesser and greater thicknesses can be employed as well. The substrate 102 can be single crystalline and or a bulk substrate, a semiconductor-on-insulator (SOI) substrate, or a hybrid substrate. An insulator layer (not shown) comprising a dielectric material such as silicon oxide, silicon nitride, silicon oxynitride, or any combination thereof can be formed on an in contact with the substrate 102.

The substrate 102 can be appropriately doped either with p-type dopant atoms or with n-type dopant atoms, or the material can be substantially undoped (intrinsic). The dopant concentration of the substrate 102 can be from $1.0\times10^{15}/cm^3$ to $1.0\times10^{19}/cm^3$, and in one embodiment, is from $1.0\times10^{16}$ $cm^3$ to $3.0\times10^{18}/cm^3$, although lesser and greater dopant concentrations are applicable as well. The counter-doped layer 104 is formed on an in contact with the substrate 102 (or a buried insulator layer if formed). The counter-doped layer 104 is formed by an epitaxial growth of a semiconductor material. The counter-doped layer can then be implanted with dopants and annealed using, for example, rapid thermal anneal. Alternatively, the counter-doped layer can be doped in-situ during the epitaxial growth. The purpose of the counter-doped layer is to provide isolation between one transistor and the next transistor. The source contact layer 106 is formed on and in contact with the counter-doped layer 104. The source contact 106 can be, for example, an n++ doped region of the substrate 102 and can have a thickness in a range of, for example, about 10 nm to about 200 nm. However, other thicknesses are applicable as well. The source contact region can be formed by epitaxial growth.

The first spacer 108 is formed on and in contact with the source layer 106. The spacer 108 comprises a dielectric material (such as silicon oxide, silicon nitride, silicon oxynitride, or a combination of these) and can be formed using any conventional deposition process such as, for example, chemical vapor deposition (CVD). The replacement gate 110 is formed on and in contact with the first spacer 110 and comprises a single layer or multiple layers of oxide, polysilicon, amorphous silicon, nitride, or a combination thereof. The replacement gate 110 can be formed by CVD processes, thermal oxidation, or wet chemical oxidation. This replacement gate stack acts as a place holder for the actual gate stack to be formed after formation of the channel material for the device(s).

The second spacer 112 is formed on and in contact with the replacement gate 110. The spacer 112 comprises a dielectric material (such as silicon oxide, silicon nitride, silicon oxynitride, or a combination of these) and can be formed using any conventional deposition process such as, for example, CVD. The first and second spacers 108, 112 can comprise the same or different materials. The top oxide layer 114 is formed on and in contact with the second spacer 112 and comprises, for example, silicon dioxide. The top oxide layer 114 is a sacrificial layer and comprises a different dielectric material than the top spacer dielectric. The purpose of the top oxide layer 114 is to enable further processing.

Figure 2:
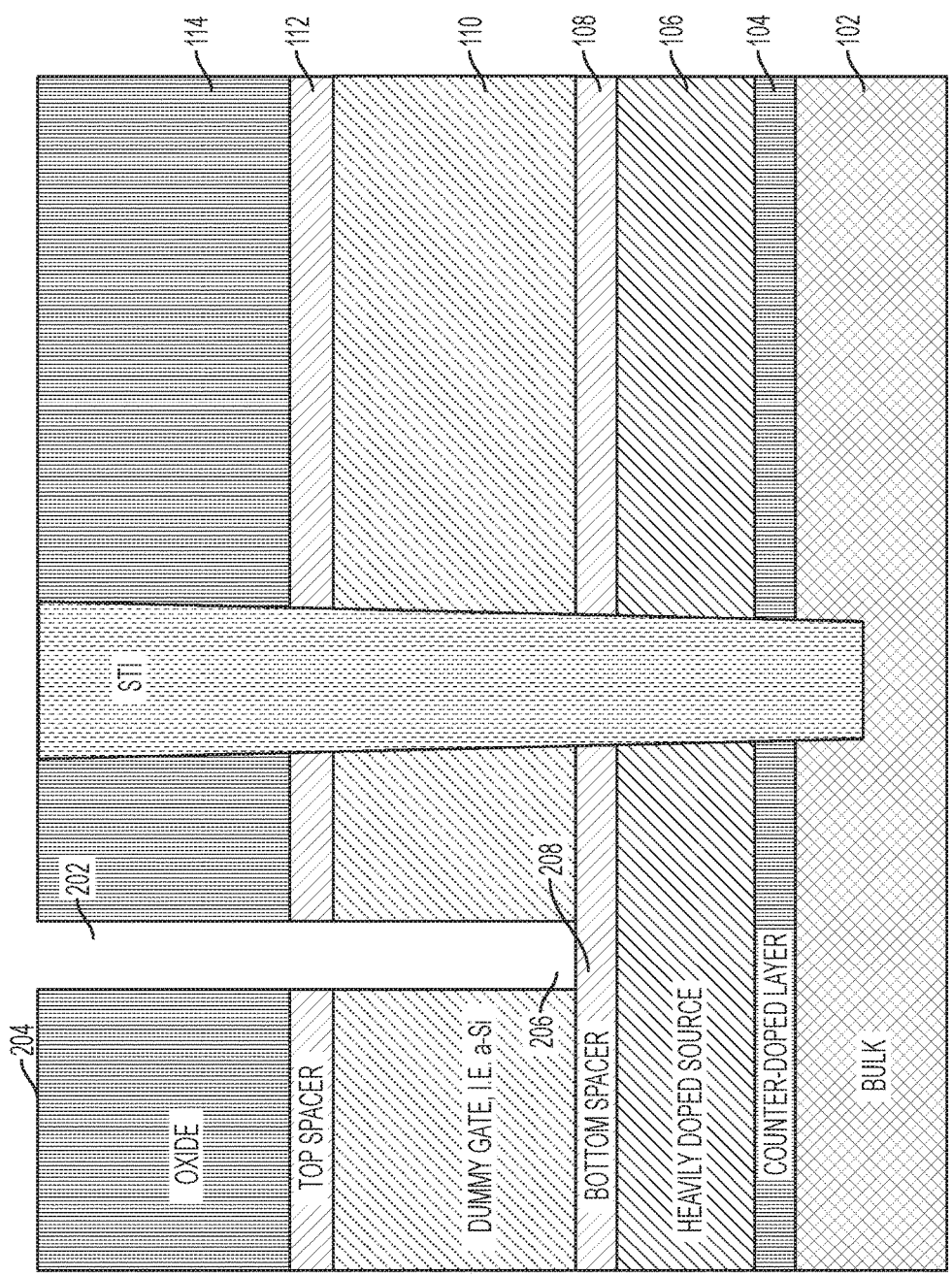
FIG. 2 is a cross-sectional view of the semiconductor structure after a first trench has been formed in a first region of the semiconductor structure according to one embodiment of the present disclosure.
Figure 3:
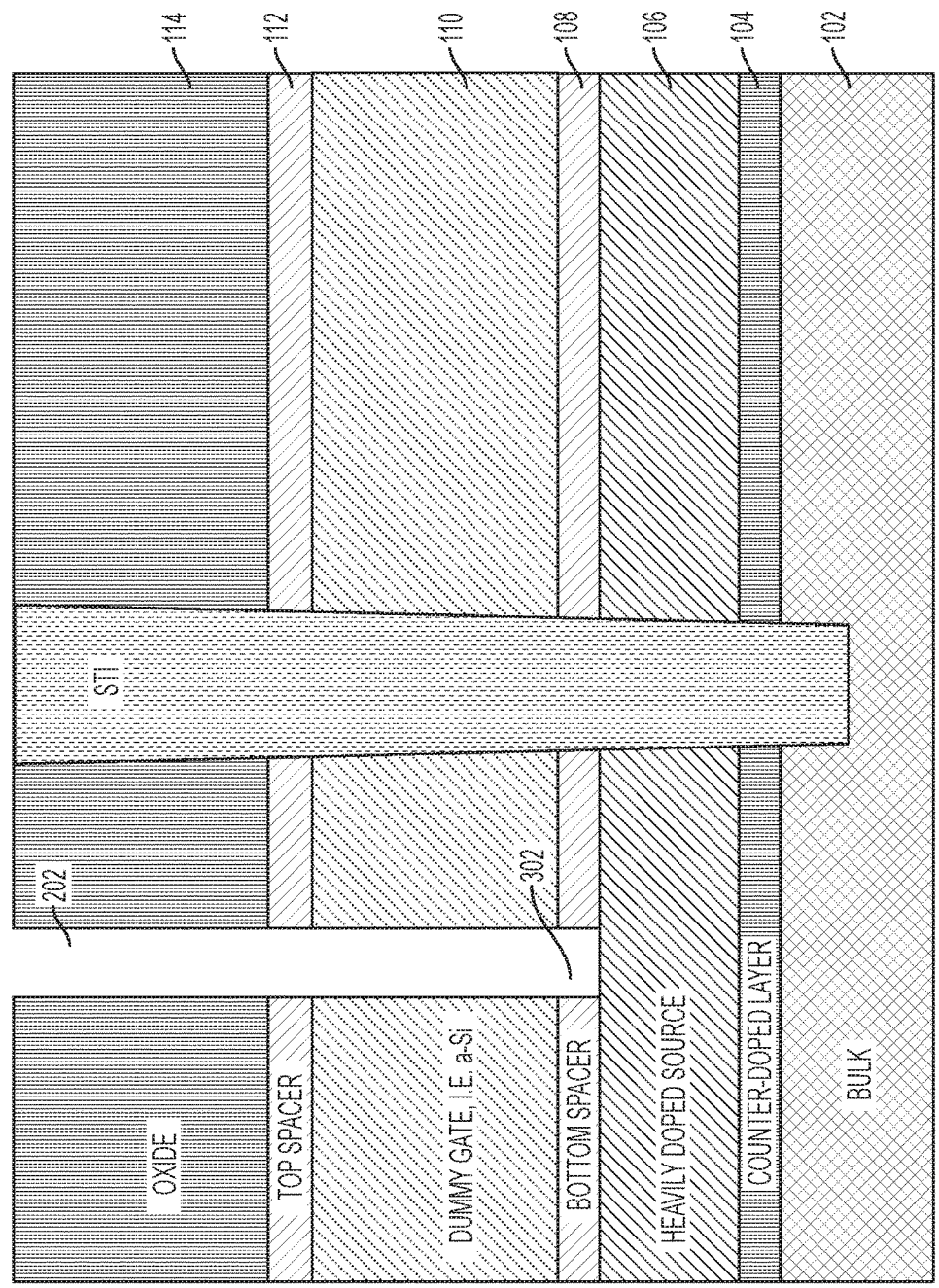
FIG. 3 is a cross-sectional view of the semiconductor structure after a portion of a bottom spacer layer exposed within the first trench has been removed according to one embodiment of the present disclosure.

FIG. 2 shows that multiple etching processes are performed to form an opening/trench 202 within the structure 100 after the structure 100 shown in FIG. 1 has been formed. For example, a first etching process is performed to remove a portion of the top oxide layer 114 selective to the material of the second spacer 112. A second etching process is then performed to remove a portion of the second spacer 112, which underlies the portion of the trench 202 formed from the first etching process, selective to the material of the replacement gate 110. A third etching process is then performed to remove a portion of the replacement gate 110, which underlies the portion of the trench 202 formed from the second etching process, selective to the material of the first spacer 106. The resulting trench 202 extends through a top surface 204 of the top oxide layer 114 down to a top surface 206 of an exposed portion 208 of the first spacer 108. The exposed portion 208 of the first spacer 108 is then removed by an etching process to expose a portion 302 of the underlying source contact layer 106, as shown in FIG. 3. This creates a self-aligned junction because a source extension can be epitaxially grown from the source layer 104 to a top surface of the first spacer layer 108.

Figure 4:
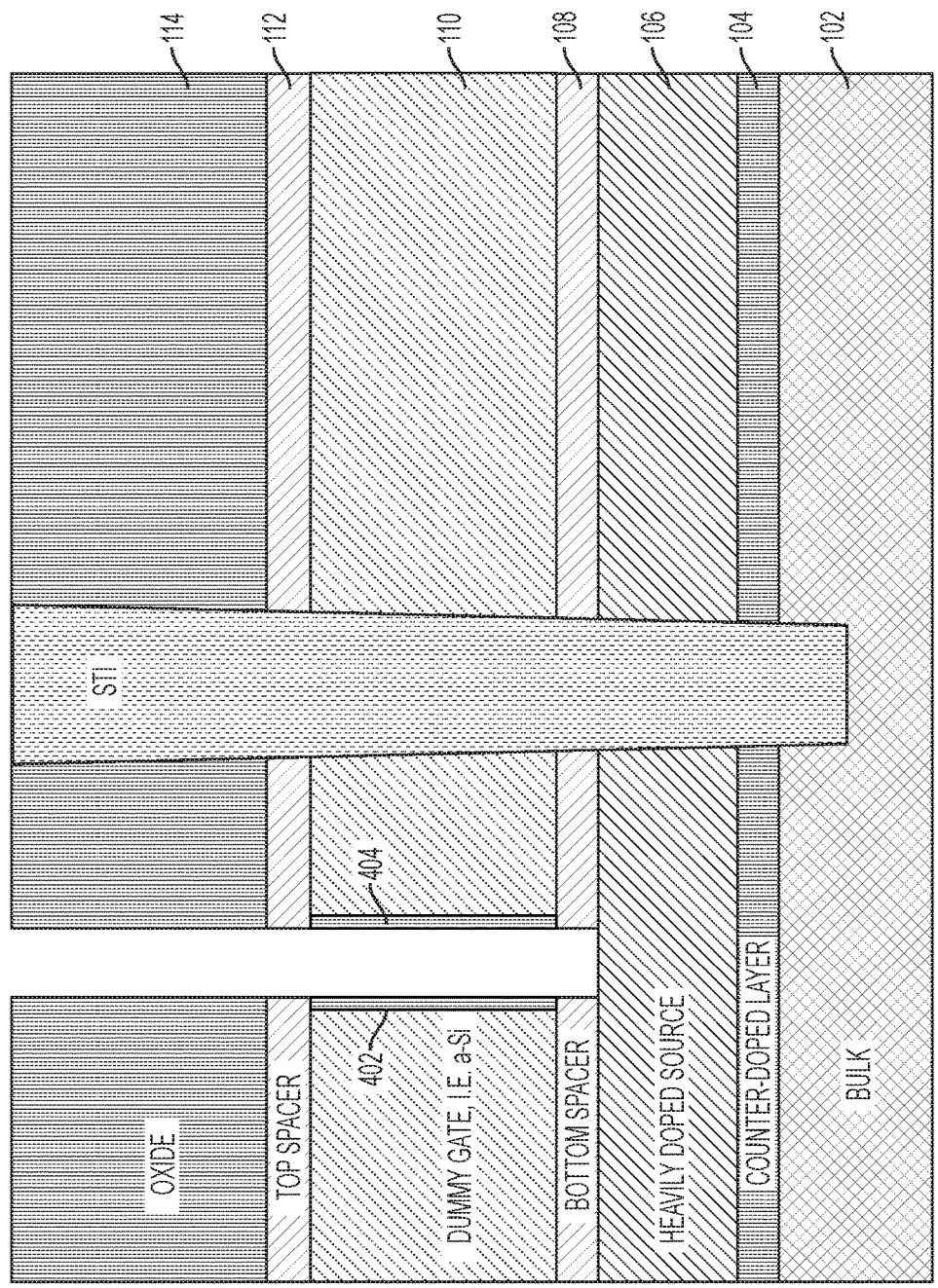
FIG. 4 is a cross-sectional view of the semiconductor structure after a protective layer has been formed on sidewalls of a replacement gate exposed within the first trench according to one embodiment of the present disclosure.
Figure 5:
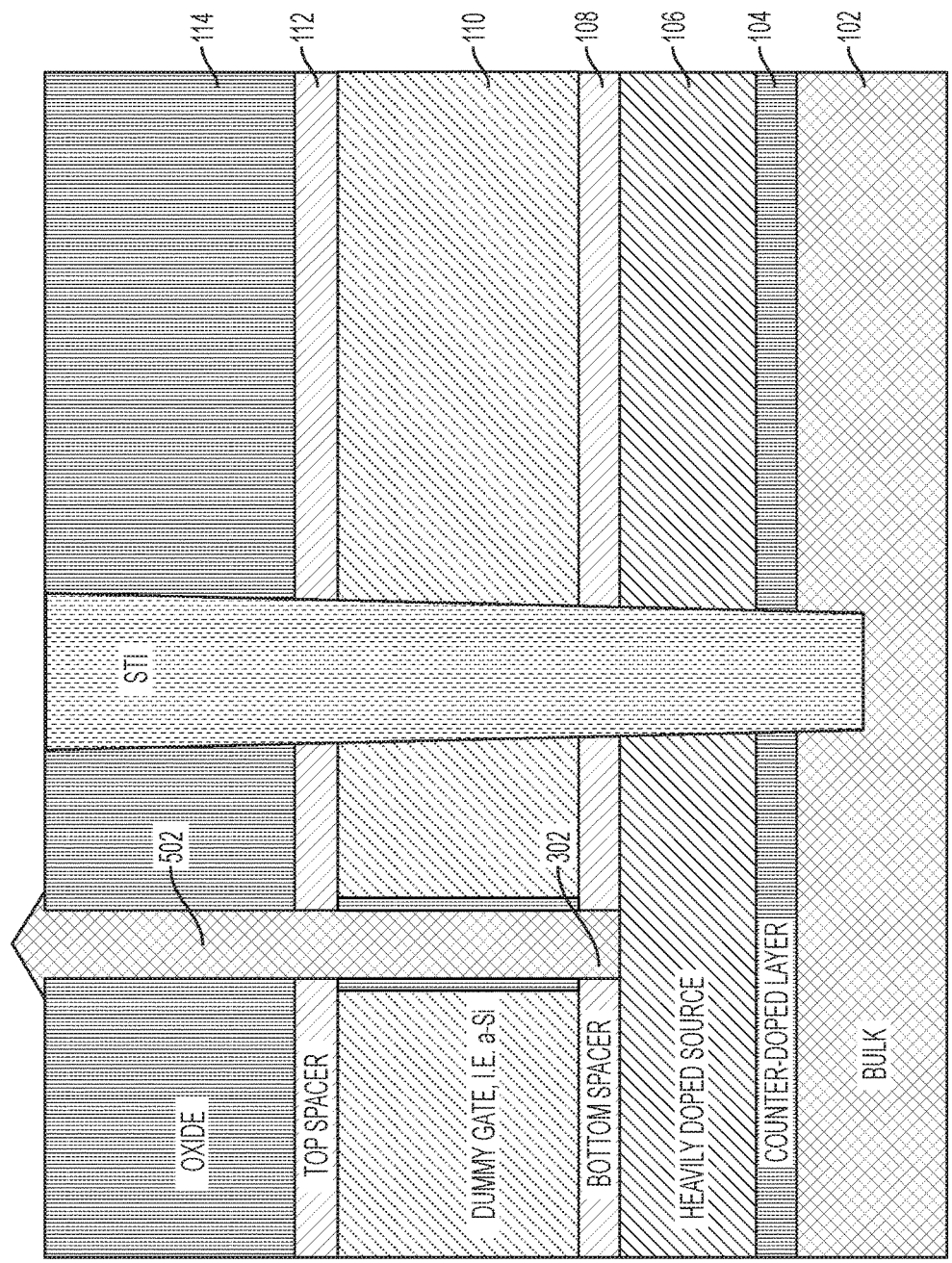
FIG. 5 is a cross-sectional view of the semiconductor structure after a first channel layer having a first doping concentration has been epitaxially grown within the first trench according to one embodiment of the present disclosure.

After the exposed portion 208 of the first spacer 108 has been etched away, a protective layer 402 is formed on exposed sidewalls 404 of the replacement gate 110 within the trench 202, as shown in FIG. 4. A plasma oxidation or other type oxidation process can be performed to form the protective layer 402. An epitaxy process is performed to grow a material 502 within the trench 202 forming a channel 532. For example, as shown in FIG. 5, the epitaxy process grows the material 502 up from the portion 302 of the source contact layer 106 exposed in the trench 202 above the top surface 204 of the top oxide layer 114. The material can have a doping level from about $1.0 \times 10^{16}/cm^3$ to about $1.0 \times 10^{18}/cm^3$.

In one embodiment, the epitaxy process grows a material that has been doped. For example, for an nFET device, the channel 502 can comprise, for example, about $1.0 \times 10^{18}/cm^3$ to about $1.0 \times 10^{17}/cm^3$ phosphorous doped silicon, about $1.0 \times 10^{17}/cm^3$ to about $1.0 \times 10^{18}/cm^3$ phosphorous doped silicon, and/or the like. For a pFET device, the channel 502 can comprise, for example, about $1.0 \times 10^{17}/cm^3$ boron doped $SiGe_{0.20}$, about $1.0 \times 10^{17}/cm^3$ boron doped $SiGe_{0.30}$, and/or the like. In another embodiment, the material is undoped, for example having a concentration of about $1.0 \times 10^{15}/cm^3$. It should be noted that these materials (e.g., Ge, III-V materials, etc.) and doping concentrations are only illustrative and other materials and concentrations are applicable as well. The channel material and doping concentrations can be selected based on the desired threshold voltage of the device.

Figure 6:
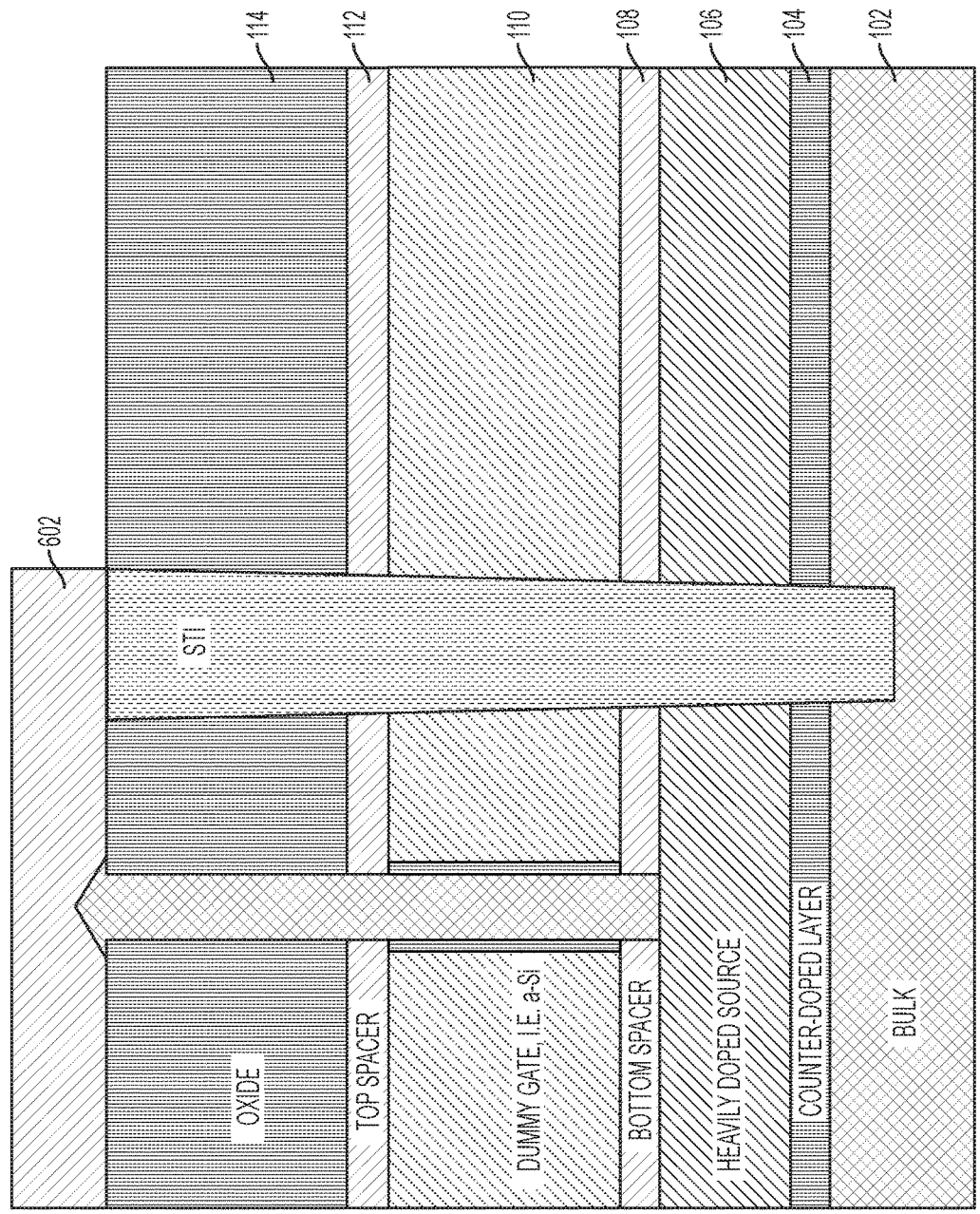
FIG. 6 is a cross-sectional view of the semiconductor structure after a hardmask has been formed on a top surface of the structure over a portion of the first channel layer according to one embodiment of the present disclosure.
Figure 7:
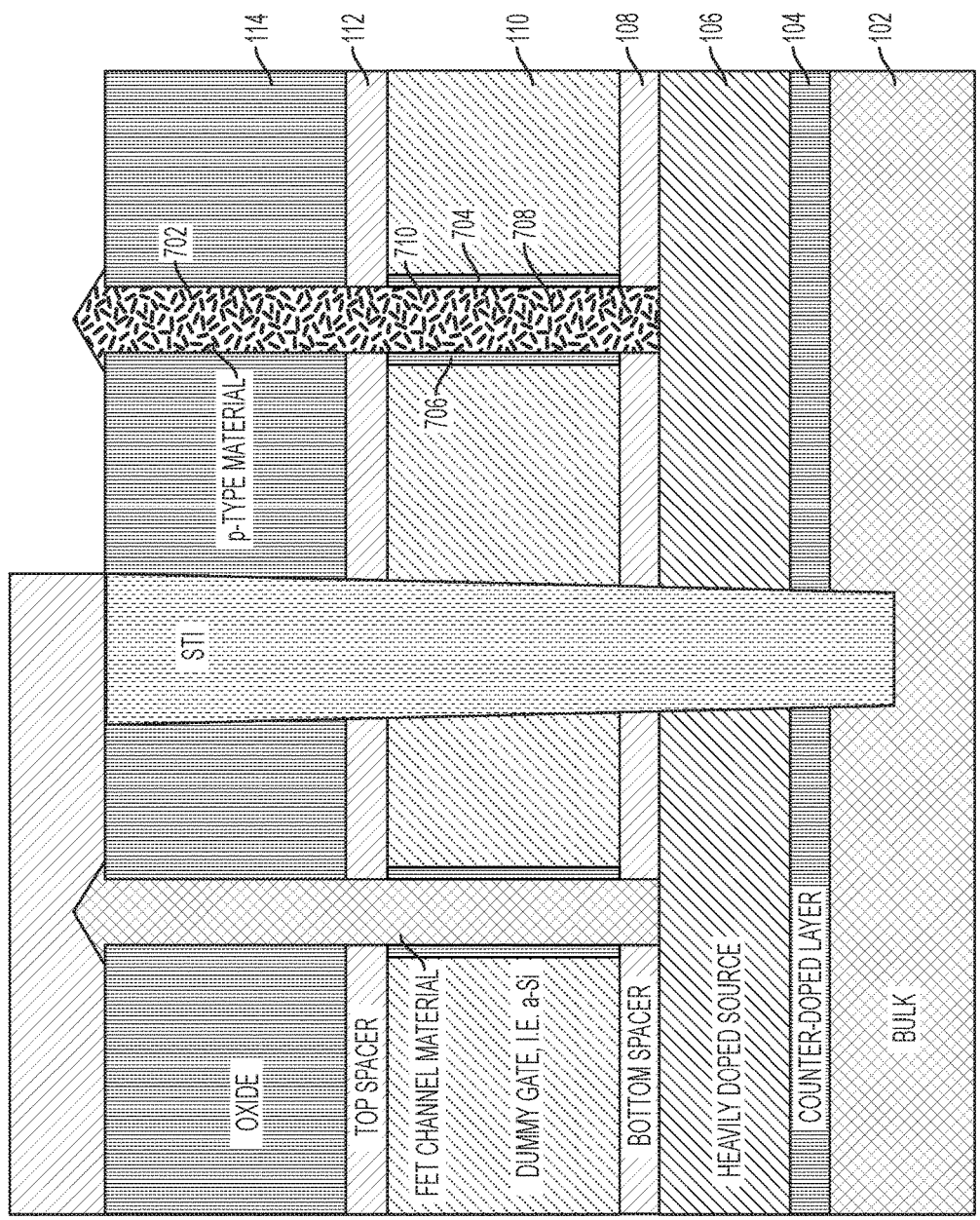
FIG. 7 is a cross-sectional view of the semiconductor structure after a second channel layer having p- or n-type material has been epitaxially grown in a second trench within a second region of the of the semiconductor structure according to one embodiment of the present disclosure.

A hardmask material such as nitride is then deposited over and in contact with the top oxide layer 114 and exposed channel material. The hardmask material is then patterned to form a hardmask 602 over the VT1 region 118 to block this region from subsequent fabrication processes performed in the VTN region 120 of the structure 100, as shown in FIG. 6. Once the hard mask 602 has been formed a channel is formed in the VTN region 120 utilizing similar fabrication processes to those discussed with respect to FIGS. 2-6. For example, FIG. 7 shows that a trench 702 has been etched through the top surface 204 of the oxide layer in the VTN region 120 of the structure 100 down to the source contact layer 106. A protective layer 704 has been formed on sidewalls 706 of a portion of the replacement gate within the VTN region 120.

An epitaxy process has been performed to grow a material up from a portion 708 of the source contact layer 106 exposed in the trench 702 above the top surface 204 of the top oxide layer 114 forming a channel 710. The material can have a doping level from about $1.0 \times 10^{16}/cm^3$ to about $1.0 \times 10^{18}/cm^3$. In one embodiment, the material is a p-type material for a p-terminal of a p-n diode. Alternatively, the material is an n-type material for an n-terminal of an n-p diode.

The first channel 502 within the VT1 region 118 can comprise same or different material(s) (the materials can be the same, both being silicon as example, but the doping is different) than the second channel 710 within the VTN region 120 of the structure 100. However, the first channel 502 comprises a material that has the same doping as the source contact to form a FET channel. The second channel comprises a material that has the opposite doping as the source contact to form a diode.

Figure 8:
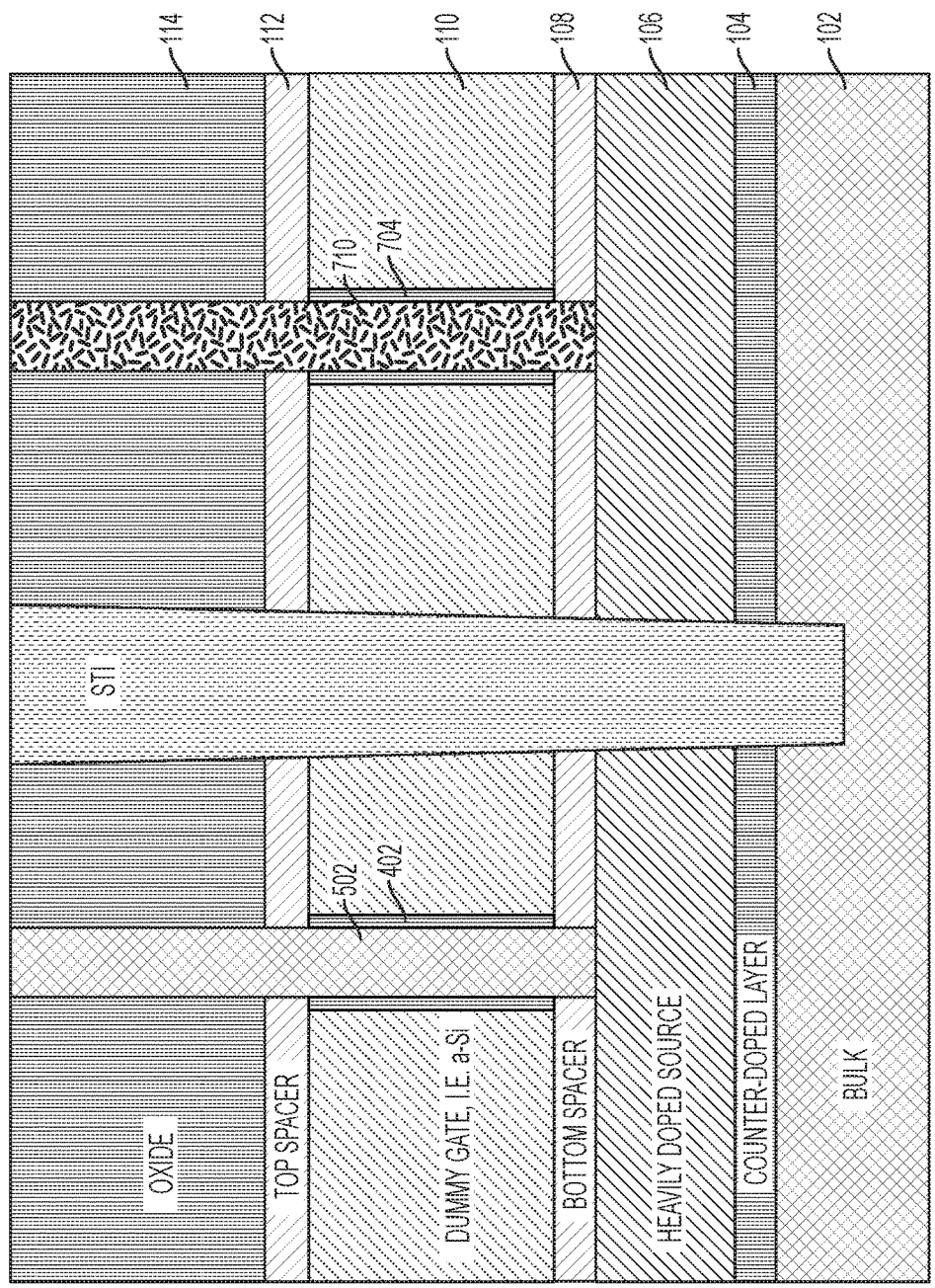
FIG. 8 is a cross-sectional view of the semiconductor structure after the hardmask and portions of the first and second channel layers extending above a top surface of the structure have been removed according to one embodiment of the present disclosure.
Figure 9:
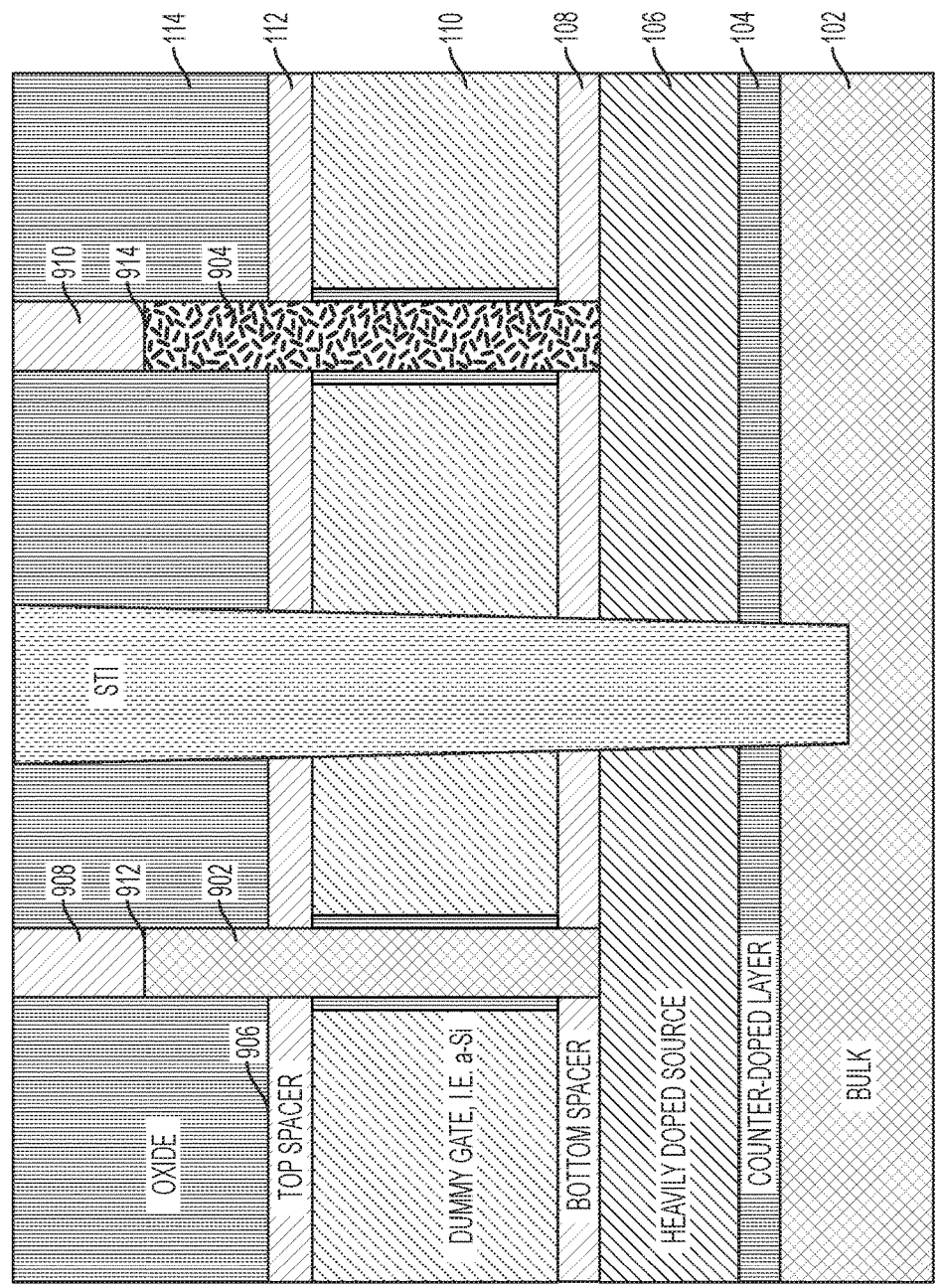
FIG. 9 is a cross-sectional view of the semiconductor structure after the first and second channel layers have been recessed and a mask formed thereon according to one embodiment of the present disclosure.

Once the second channel 710 has been formed, the hardmask 602 and any overgrowth of channel material are removed by, for example, a chemical-mechanical polishing (CMP) process that stops on the top oxide layer 114, as shown in FIG. 8. FIG. 9 shows a portion of the first and second channels 502, 710 being partially recessed via an etching process. In this embodiment, the channels 502, 710 are partially recessed so that a portion 902, 904 (e.g., 15-50 nm) of each channel 502, 710 remains above a top surface 906 of the second spacer 112. A masking material such as nitride is then deposited and polished back (stopping on the top oxide layer 114) to form a mask layer 908, 910 on and in contact with a top surface 912, 914 of the channels 502, 710.

Figure 10:
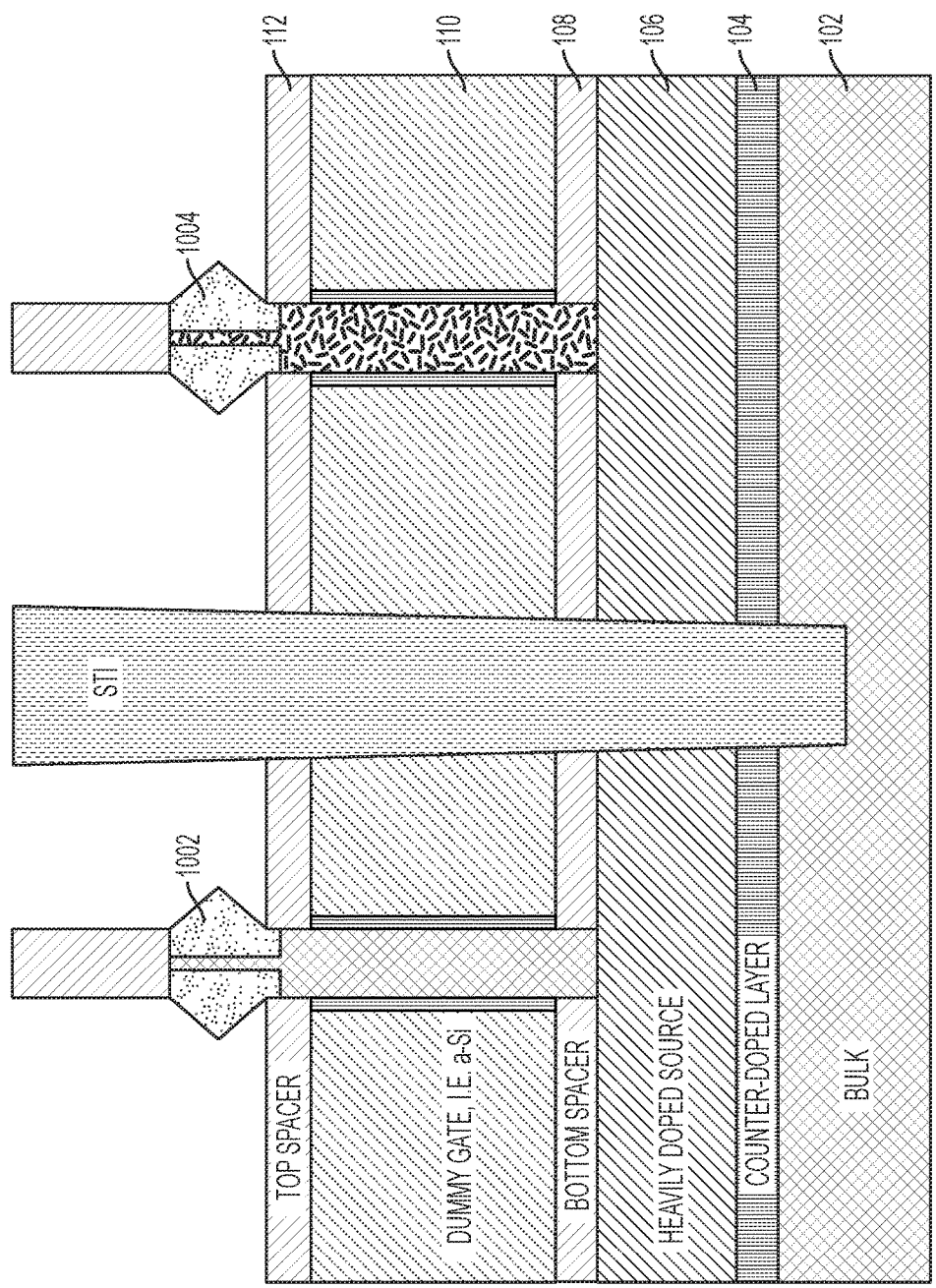
FIG. 10 is a cross-sectional view of the semiconductor structure after drain regions have been formed on the narrowed portions of the first and second channel layers according to one embodiment of the present disclosure.

FIG. 10 shows that the top oxide layer 114 is removed by, for example, by a wet etch process using diluted hydrofluoric acid, stopping on the second spacer layer 112. A lateral etch is then performed to narrow a portion 1002, 1004 of the channels 502, 710 where drain terminals of the devices are to be formed. The narrowed portions 1002, 1004 comprise the portions 902, 904 of the channels 502, 710 remaining above the second spacer 112 and a portion of the channels 502, 710 extending below the top surface 906 of the second spacer 112 and above a bottom surface 1006 of the second spacer 112. In one embodiment, the narrowed portions 1002, 1004 of the channels 502, 710 comprise a width of, for example 2 nm to 5 nm while the remaining portions 1008, 1010 of the channels 502, 710 comprise a width of width of 4 nm to 10 nm. The lateral etch can be, for example, a wet etch process.

A drain 1102, 1104 is then formed on the narrowed portions 1002, 1004 of the channels 502, 710 in each of the VT1 and VTN regions 118, 120. The drains 1102, 1104 extend from laterally from a top portion 1106, 1108 of the narrowed portions 1002, 1004 beyond the sidewalls 1110, 1112 of the un-narrowed portions 1008, 1010 of the channels 502, 710 and down to a top surface 1114, 1116 of the un-narrowed portions 1008, 1010. Therefore, a bottom portion 1118, 1120 of the drains 1102, 1104 is below the top surface 906 of the second spacer 112 and above the bottom surface 1006 of the second spacer 112.

The drains 1102, 1104 can be formed using an epitaxy process. The drain material can having a doping level of about $2 \times 10^{20}$ cm$^3$ to about $2 \times 10^{21}$ cm$^3$. For example, epitaxy that is selective with respect to the materials of the mask layers 908, 910 and the second spacer 112 is used grow material from the narrowed portions 1002, 1004 of the channels 502, 710 to form the drains 1102, 1104. The drains 1102, 1104 comprise in-situ doping (boron, in one embodiment for pFET and phosphorus, in one embodiment, for nFET). It should be noted that, according to one embodiment, the drains 1102, 1104 may not contain any doping. In the present embodiment, the doping can be performed using any standard approach such as ion implantation. In particular, the growth rates for (100) vs. (110) oriented planes are engineered so that during the epitaxial growth on (100) Si faceted drains are obtained. The drains 1102, 1104 comprise angled sides rather than completely abutting the gate. It should be noted that, non-faceted (i.e. vertical) epitaxy and/or multiple epitaxy steps can be used to form the drain structure without limiting the scope of the present disclosure.

Figure 11:
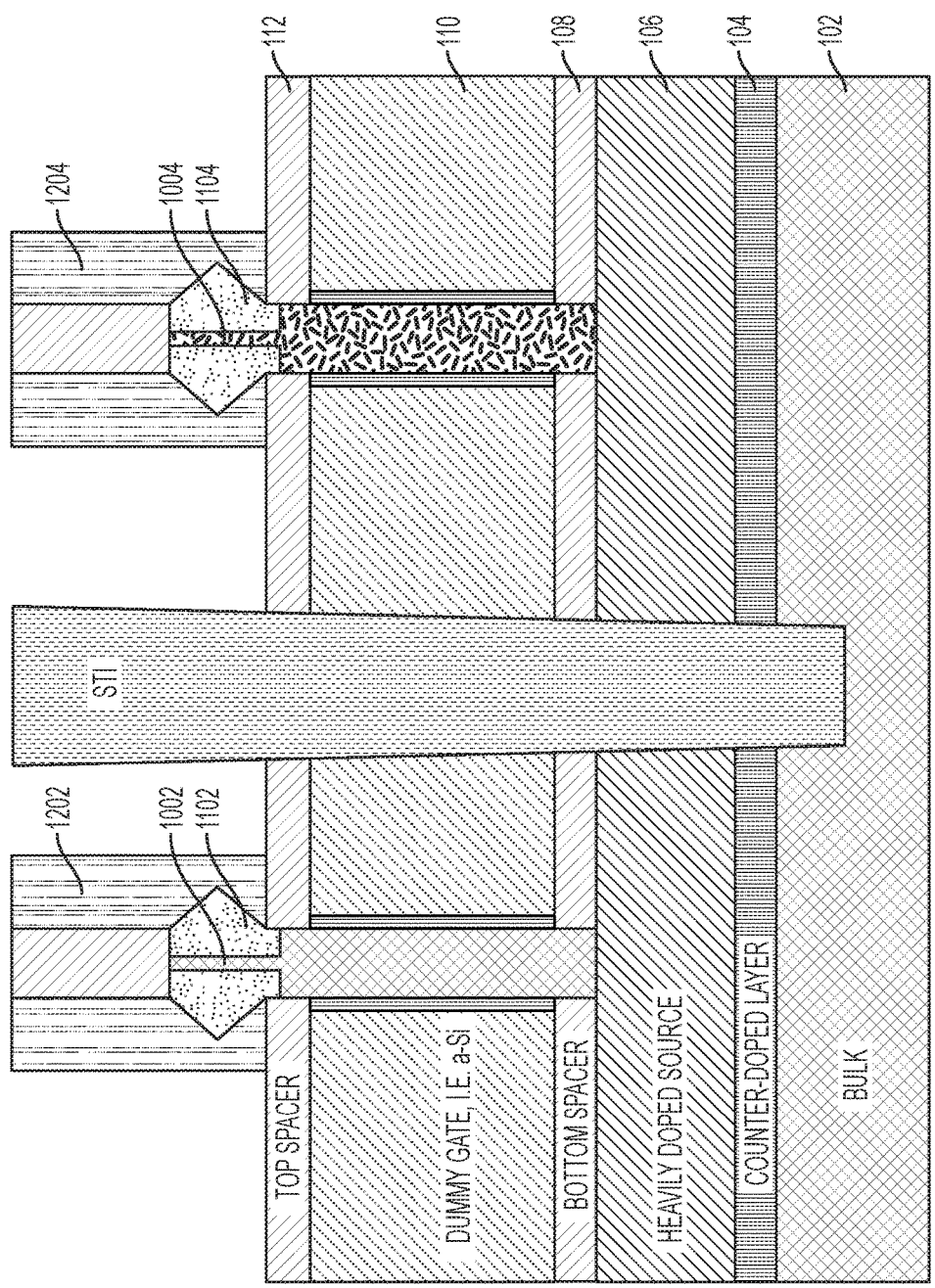
FIG. 11 is a cross-sectional view of the semiconductor structure after spacers have been formed on the drain regions, masks, and top spacer layer of the structure according to one embodiment of the present disclosure.

FIG. 11 shows that sacrificial spacers 1202, 1204 comprising a dielectric material (such as silicon oxide, silicon nitride, silicon oxynitride, or a combination of these) is formed on and in contact with the sidewalls of the mask layers 908, 910, the sidewalls of the drains 1102, 1104, and the top surface 906 of the second spacer layer 112. The sacrificial spacers 1202, 1204 can extend 2 nm to 10 nm past the edge of the drain epitaxy on each side. The spacers 1202, 1204 extend laterally beyond the drains 1102, 1104 and are planar with a top surface of the mask layers 908, 910. In the illustrated embodiment, the dielectric material is formed and then reactive-ion etching is used to remove the dielectric material except from the sidewalls of the mask layers 908, 910, the sidewalls of the drains 1102, 1104, and the top surface 906 of the second spacer layer 112.

Figure 12:
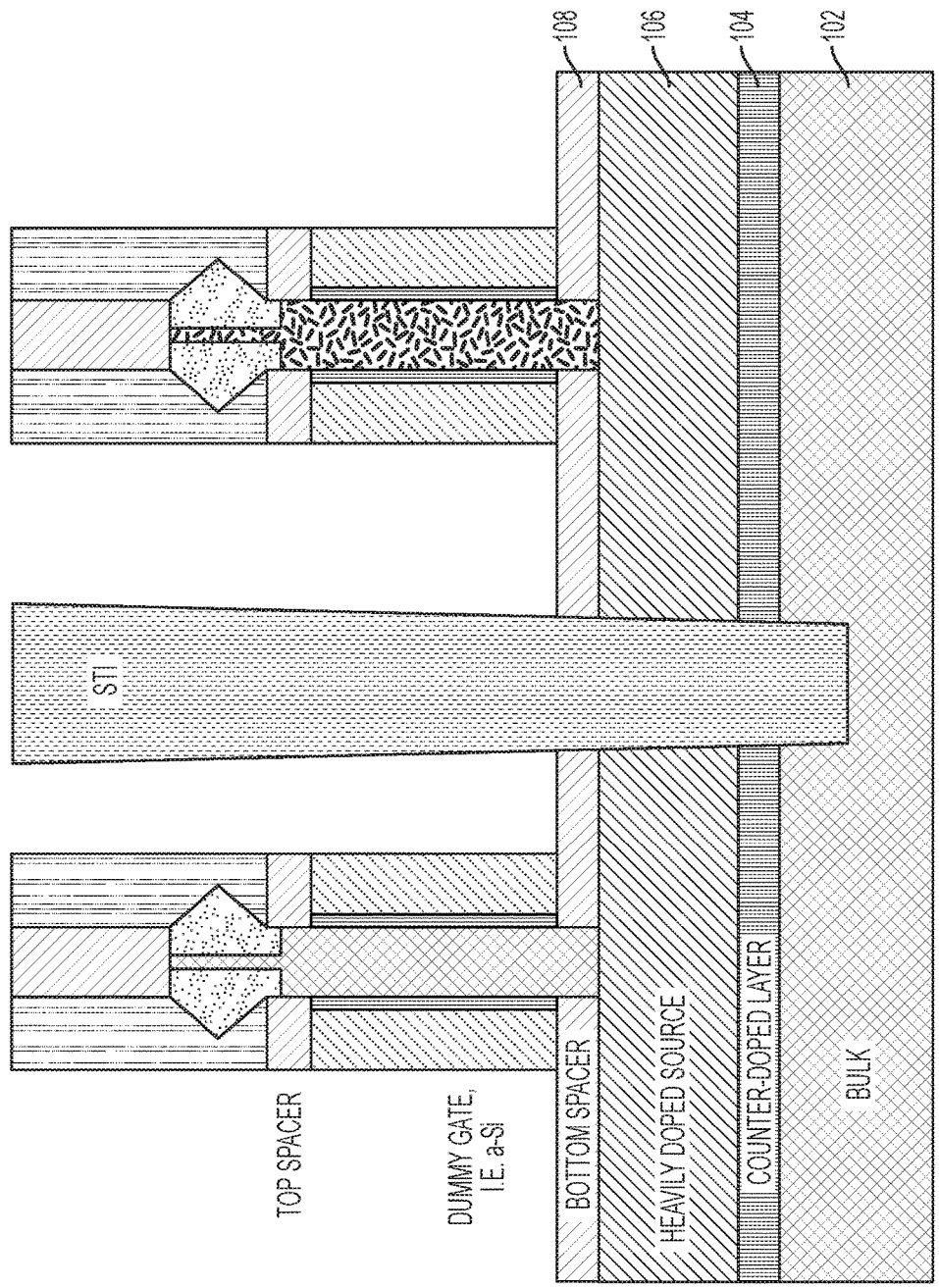
FIG. 12 is a cross-sectional view of the semiconductor structure after portions of the structure not underlying the spacers have been removed down to a bottom spacer layer according to one embodiment of the present disclosure.
Figure 13:
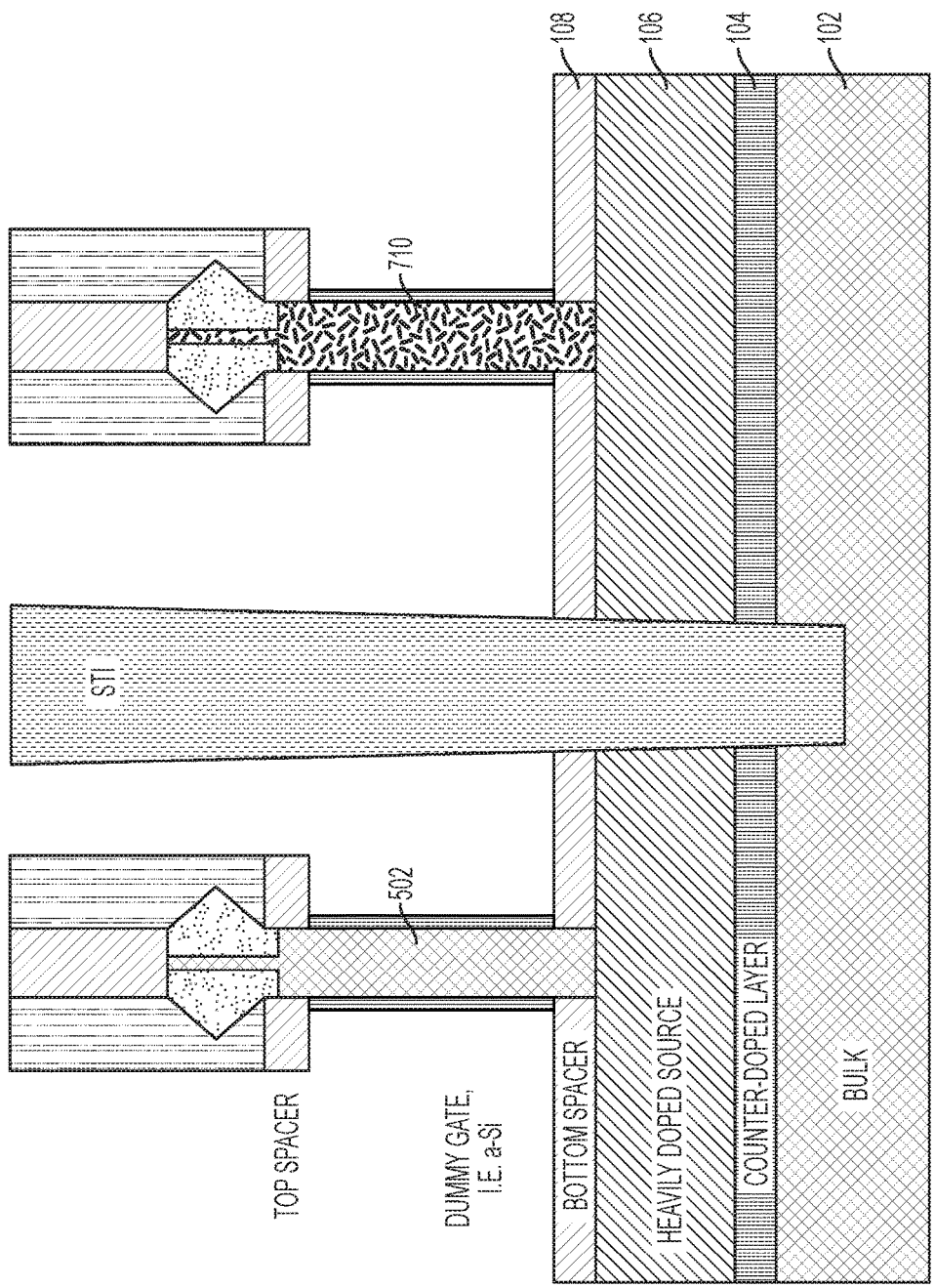
FIG. 13 is a cross-sectional view of the semiconductor structure after a replacement gate has been removed exposing portions of the first and second channel layers according to one embodiment of the present disclosure.

Portions of the second spacer layer 112 and portions of the replacement gate 110 not underlying the sacrificial spacers 1202, 1204 are then removed, as shown in FIG. 12. For example, a first etching process such as RIE is performed to etch portions of the replacement gate 110 not underlying the sacrificial spacers 1202, 1204 selective to the replacement gate 110. Then, a second etching process such as RIE is then performed to etch portions of the replacement gate 110 not underlying the sacrificial spacers 1202, 1204 selective to the first spacer layer 108. Portions of the replacement gate 110 underlying the sacrificial spacers 1202, 1204 and the protective layers 402, 704 are then removed exposing the channels 502, 710, as shown in FIG. 13. The portions of the replacement gate 110 underlying the sacrificial spacers 1202, 1204 and the protective layers 402, 704 can be removed by selective etching or another technique.

Figure 14:
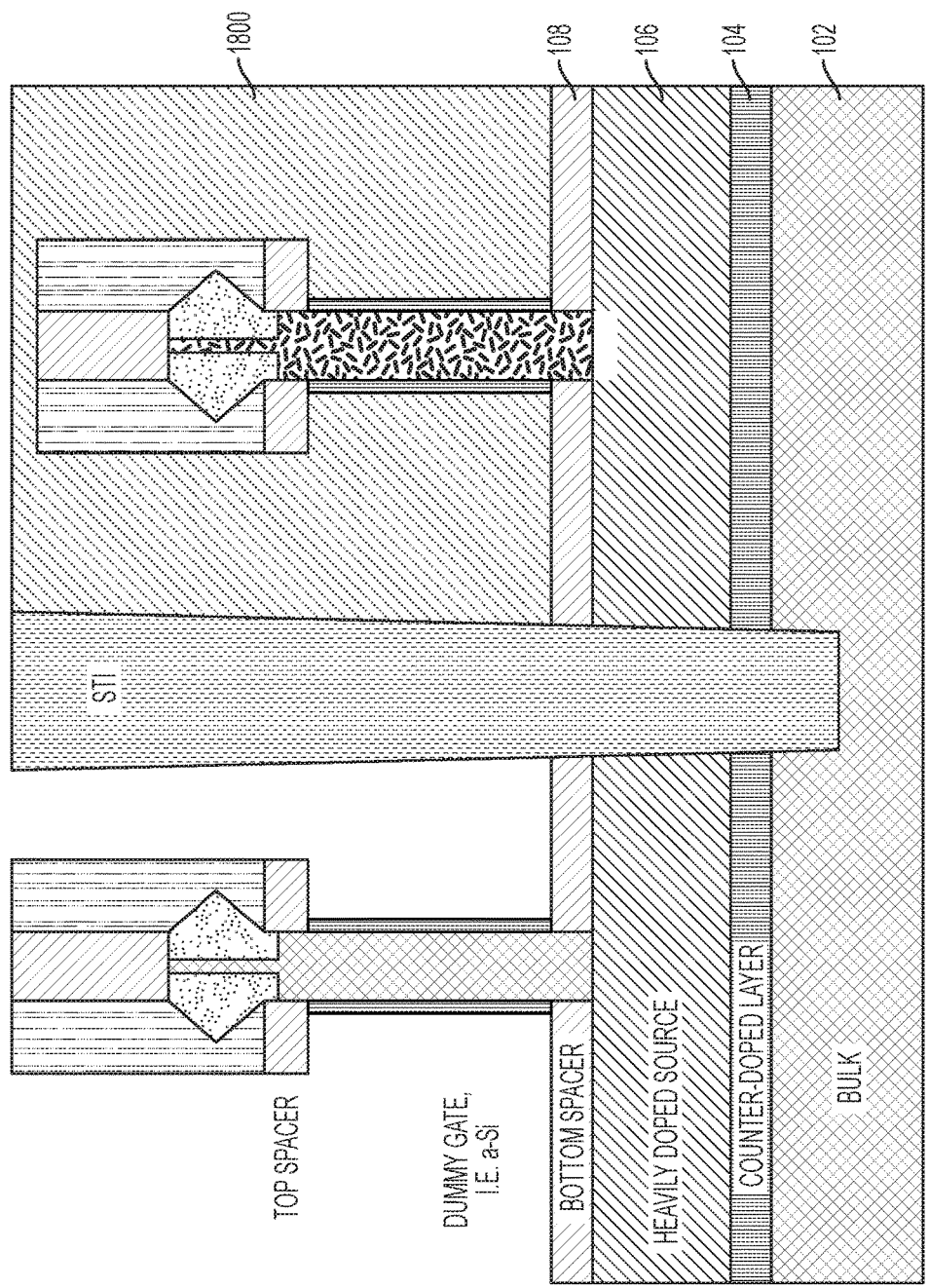
FIG. 14 is a cross-sectional view of the semiconductor structure after a block mask has been deposited on the diode region according to one embodiment of the present disclosure.

The diode region is blocked by a block mask 1800 as shown in FIG. 14. The block mask comprises a single layer or multiple layers of oxide, polysilicon, amorphous silicon, nitride, or a combination thereof. The block mask can be formed by CVD processes, thermal oxidation, or wet chemical oxidation. The diode block mask allows for further processing of the VT1 region.

Figure 15:
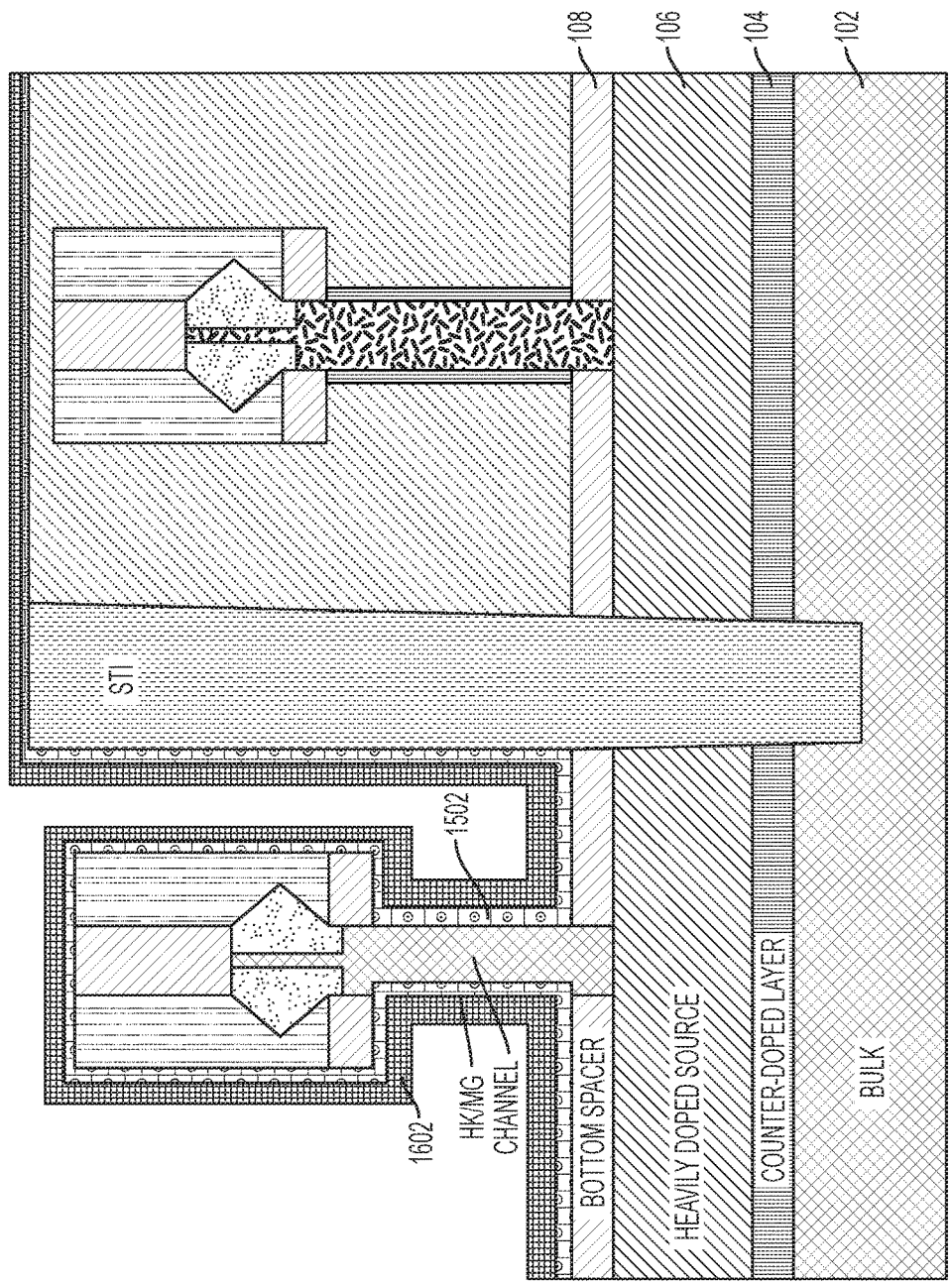
FIG. 15 is a cross-sectional view of the semiconductor structure after deposition of high K metal gate material according to one embodiment of the present disclosure.

Once the replacement gate 110 and protective layers 402, 704 have been removed and the diode region blocked, an RMG process is performed. For example, as shown in FIG. 15, a high-k dielectric material is blanket deposited over the entire structure 100, for example by CVD (chemical vapor deposition), PECVD (plasma enhanced chemical vapor deposition), or ALD (Atomic layer deposition). The high-k gate dielectric layer 1502 is formed on, and in contact with the sidewalls of the FET channel 502. The high-K gate dielectric layer 1502 can have a thickness between about 0.1 nm and about 3 nm. In one embodiment, the configuration of the high-k gate dielectric layer 1502 forms a C or rotated U shape.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

Still referring to FIG. 15, one or more conductive materials 1602 are then deposited on the high-k gate dielectric layer 1502. In one embodiment, the conductive material comprises polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. The conductive material may comprises multiple layers such as gate workfunction setting layer (work function metal) and gate conductive layer.

Figure 16:
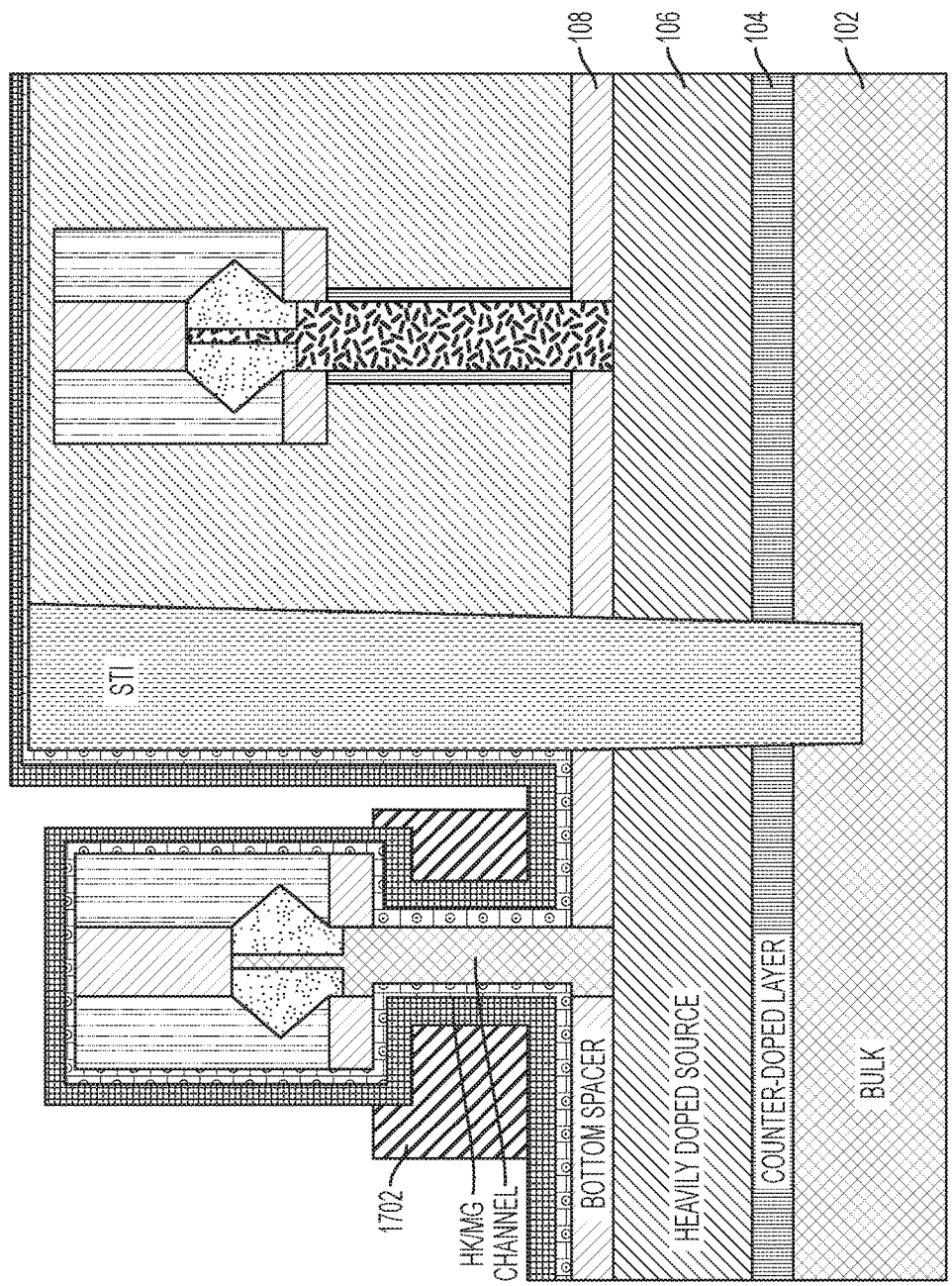
FIG. 16 is a cross-sectional view of the semiconductor structure after deposition of metal gate fill material according to one embodiment of the present disclosure.
Figure 17:
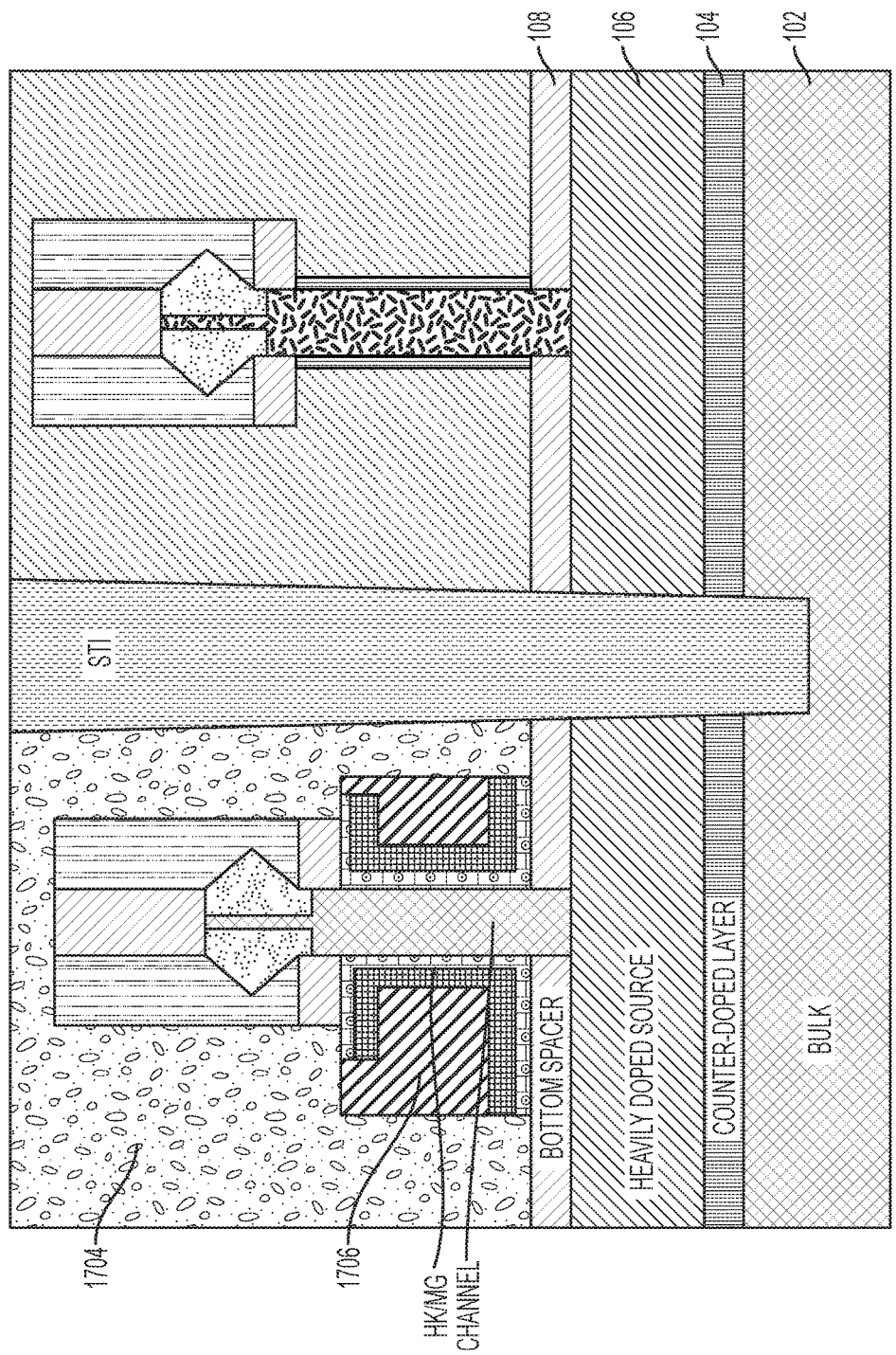
FIG. 17 is a cross-sectional view of the semiconductor structure after deposition of interlayer dielectric (ILD) according to one embodiment of the present disclosure.
Figure 18:
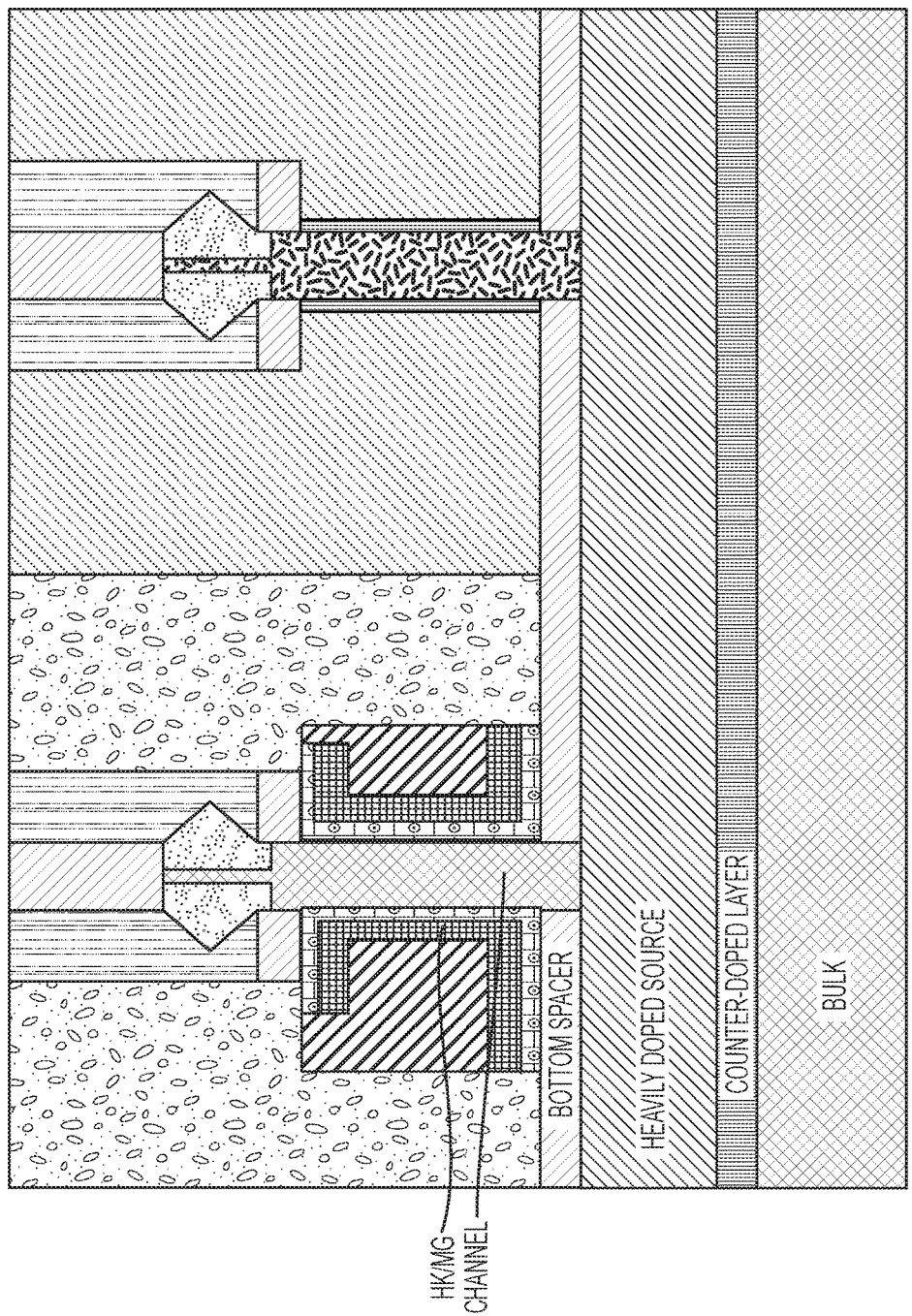
FIG. 18 is a cross-sectional view of the semiconductor structure after lithography/etching of the gate fill material according to one embodiment of the present disclosure.
Figure 19:
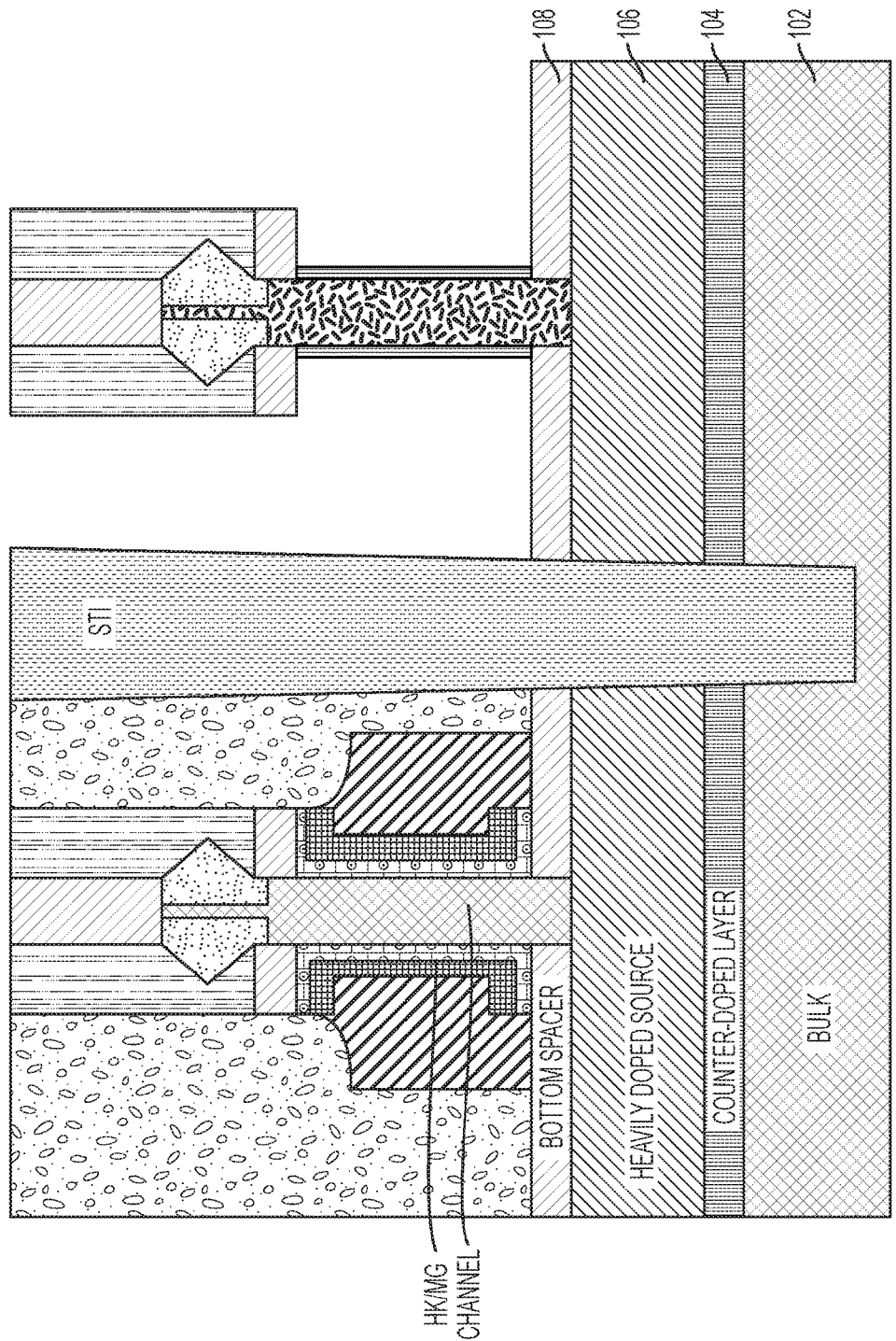
FIG. 19 is a cross-sectional view of the semiconductor structure after the diode block mask has been removed according to one embodiment of the present disclosure.
Figure 20:
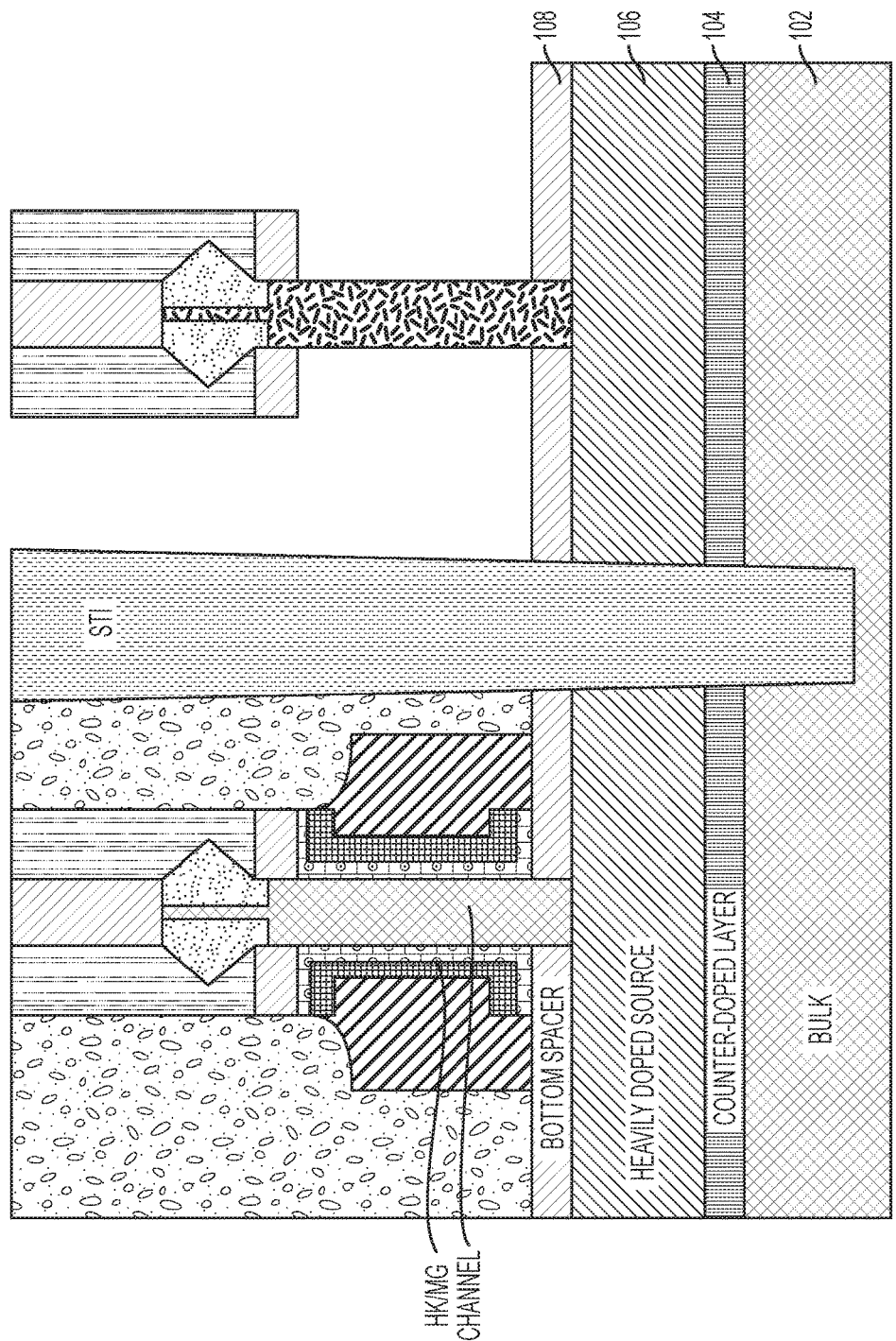
FIG. 20 is a cross-sectional view of the semiconductor structure after the thin oxide layer has been removed from the second channel according to one embodiment of the present disclosure.
Figure 21:
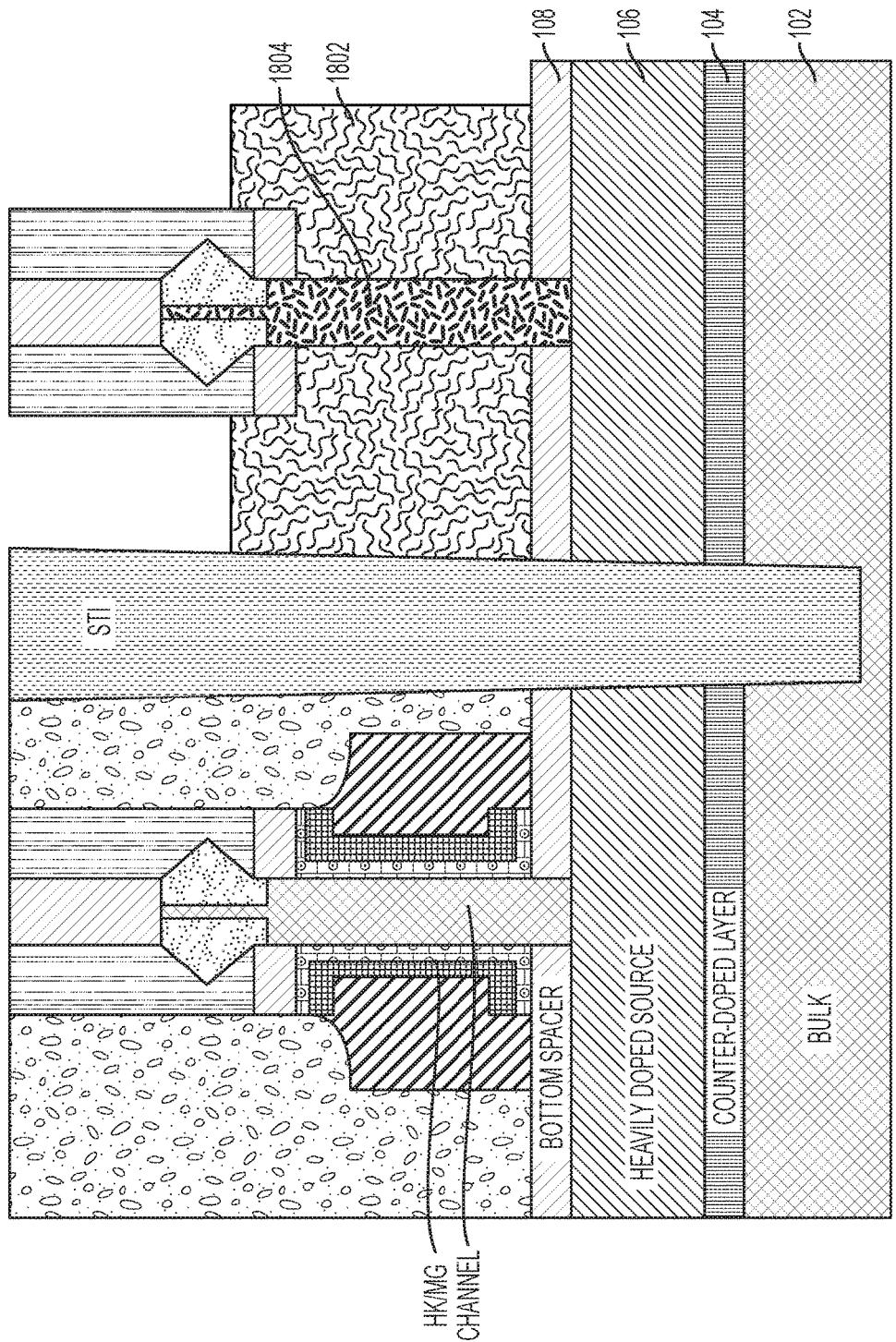
FIG. 21 is a cross-sectional view of the semiconductor structure after diode region 2 has been epitaxially grown around diode region 1 according to one embodiment of the present disclosure.
Figure 22:
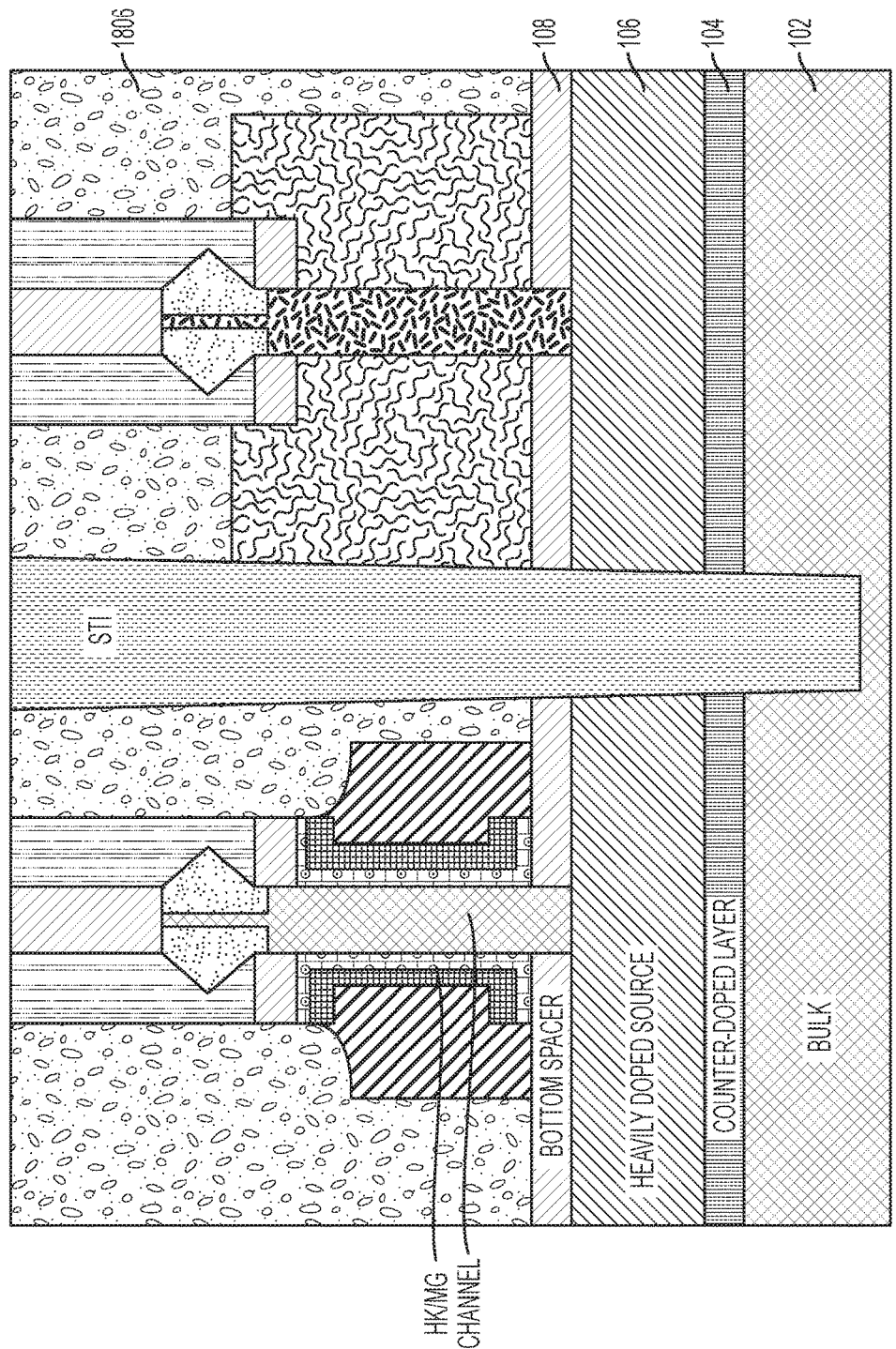
FIG. 22 is a cross-sectional view of the semiconductor structure after ILD deposition and CMP of the VTN region according to one embodiment of the present disclosure.
Figure 23:
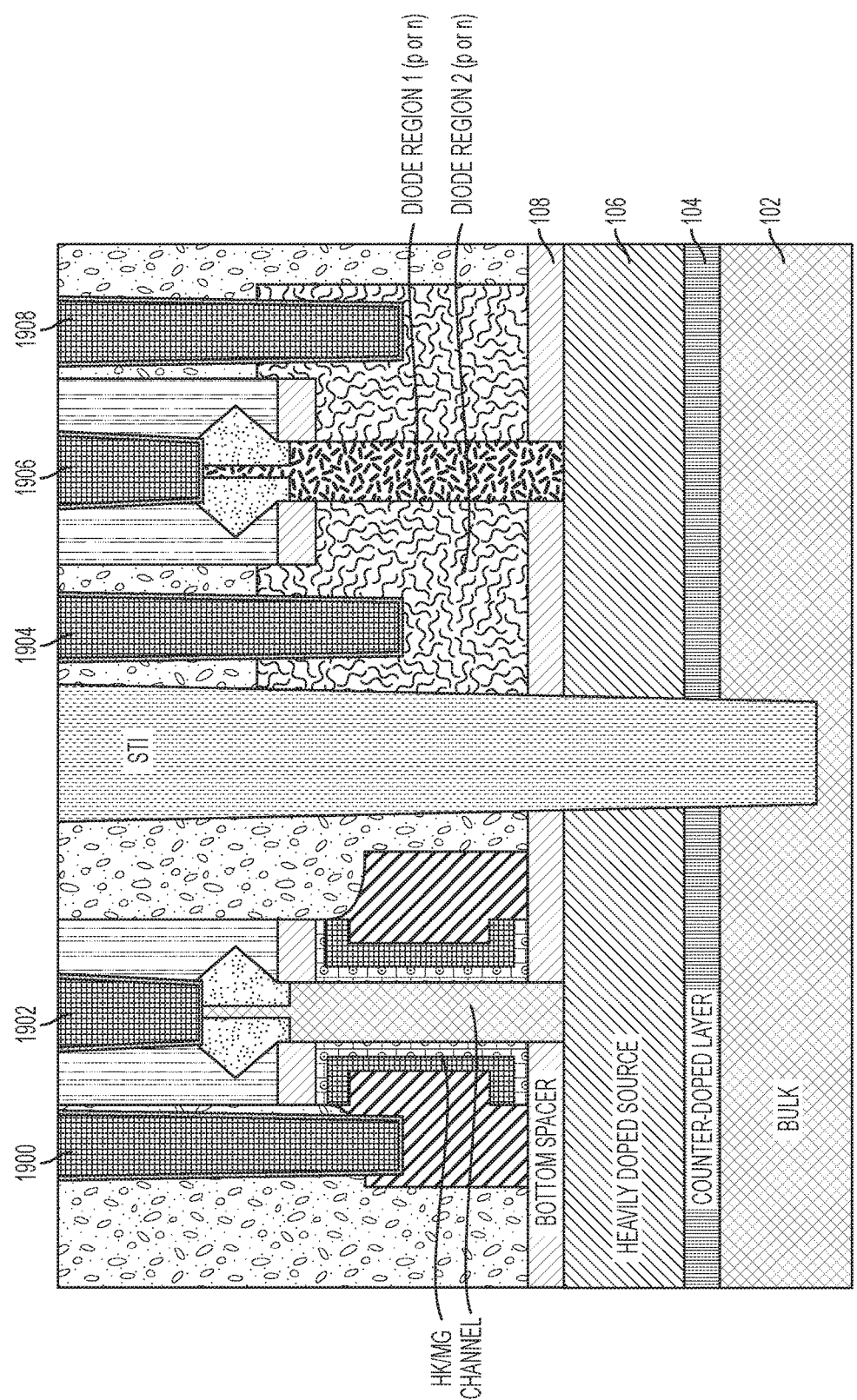
FIG. 23 is a cross-sectional view of the semiconductor structure after MOL formation according to one embodiment of the present disclosure.
Figure 24:
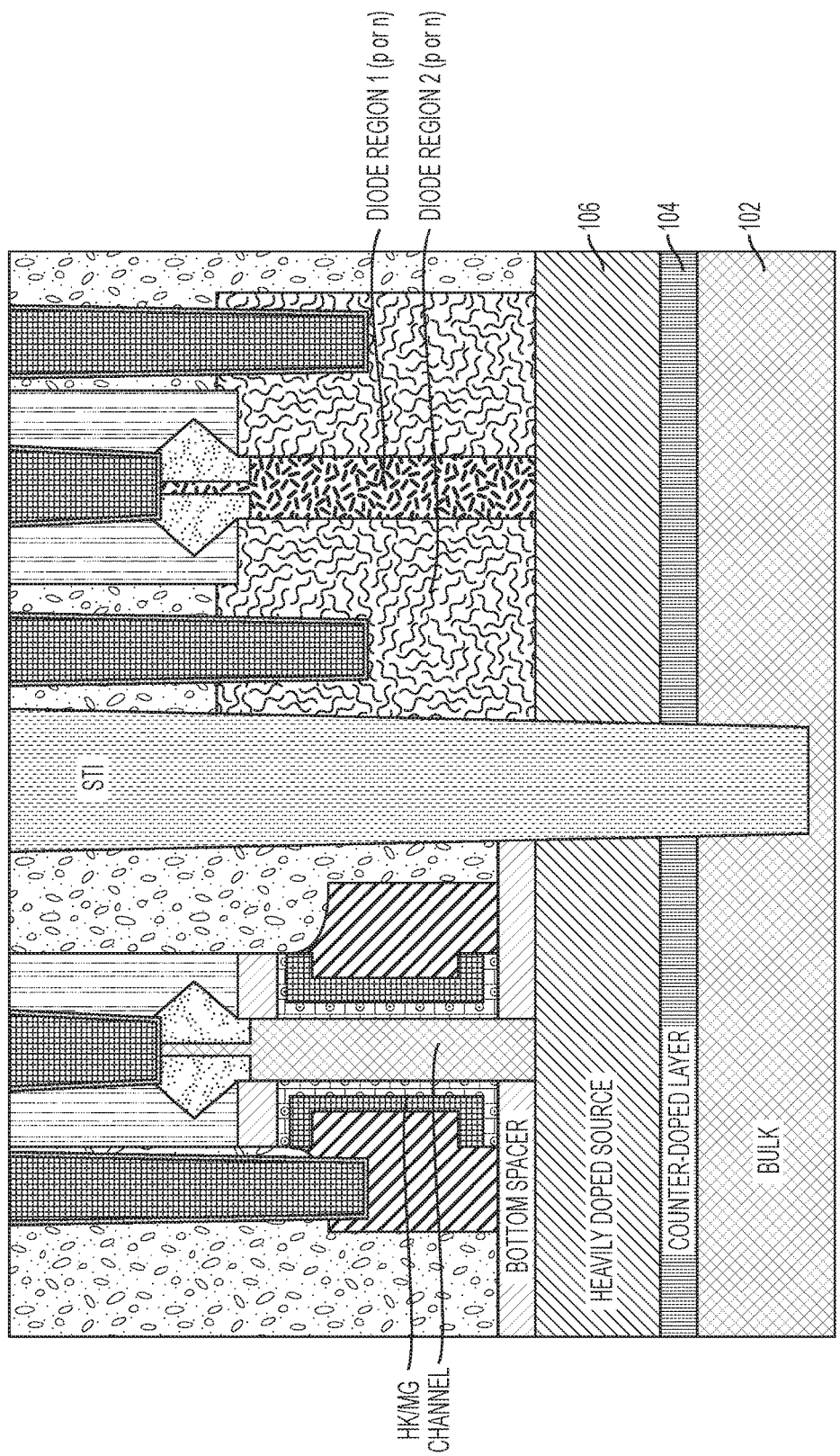
FIG. 24 is a cross-sectional view of the semiconductor structure after the bottom spacer in the diode region is removed before the epitaxial growth of diode region 2.

FIG. 16 shows that a gate fill material layer 1702 is blanket deposited over the VT1 structure 118. The gate fill material layer 1702 can be, for example, tungsten or aluminum. FIG. 17 shows that an ILD material is deposited over the VT1 structure. FIG. 18 shows the gate fill material layer 1702 is polished using, for example, CMP. The gate fill material layer 1702 can be recessed. Lithography and etching processes are used to pattern the recessed gate fill material layer 1702. The conductive layer 1602 is etched/polished, for example by RIE to form metal gate 1706 conforming to and in contact with the high-k gate dielectric layer 1502. The metal gate 1706 comprises a configuration similar to that of the high-k gate dielectric layer 1502. The metal gate 1706 can have a thickness between about 20 nm and about 50 nm As shown in FIGS. 19-22, the diode region is processed. As shown in FIG. 19, the diode block mask 1800 is removed, for example, by an etching process such as RIE. In FIG. 20, the thin oxide protective layer 704 is removed. As shown in FIG. 21, an epitaxial process is used to grow diode region 2 1802. The material can have a doping level from about $1.0 \times 10^{16}/cm^3$ to about $1.0 \times 10^{18}/cm^3$. Diode region 2 1802 surrounds diode region 1 1804. Diode region 2 comprises a material that has opposite doping of diode region 1. In this manner, a diode junction is formed on the source contact. As shown in FIG. 22, an interlayer dielectric 1806 is deposited and CMP. As shown in FIG. 23, metal oxide layer contacts 1900, 1902, 1904, 1906, 1908 are formed by etching to form trenches followed by a metallization process. The metallization can involve CVD, PVD, ALD, or electroplating processes or some combination of these processes. In an alternative embodiment shown in FIG. 24, the bottom spacer 108 in the diode region is removed before the epitaxial growth of diode region 2 1802. In this embodiment the junction area is increased by using the bottom surface as part of the diode.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The methods depicted herein are just one example. There may be many variations to the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor structure, the method comprising:
    forming a structure comprising a substrate, a source contact layer on the substrate, a first spacer layer on the source contact layer, a replacement gate on the first spacer layer, a second spacer layer on the replacement gate, and an insulating layer on the second spacer layer;
    forming a first trench in a first region of the structure, the first trench extending from a top surface of the insulating layer down to a top surface of the source contact layer;
    epitaxially growing a first channel layer up from the top surface of the source contact layer, the first channel layer filling the first trench;
    forming a second trench in a second region of the structure, the second trench extending from the top surface of the insulating layer down to the top surface of the source contact layer;
    epitaxially growing a second channel layer comprising a p- or n-type material up from the top surface of the source contact layer, the second channel layer filling the second trench, where the p- or n-type material has an opposite doping than the source contact layer to form a diode;
    recessing the first and second channel layers, the recessing leaving a first portion of the first and second channel layers above the second spacer layer;
    after the recessing, forming a first mask above and in contact with the first channel layer and forming a second mask above and in contact with second channel layer;
    after forming the first and second masks, removing the insulating layer exposing the first portion of the first and second channel layers; and
    performing a lateral etch of the first portion of the first and second channel layers, the lateral etch narrowing the first portion of the first and second channel layers and a second portion of the first and second channel layers below a top surface of the second spacer layer.

2. The method of claim 1 further comprising after epitaxially growing the first channel material, forming a hardmask over the first region of the structure prior to forming the second trench.

3. The method of claim 1 further comprising:
    prior to epitaxially growing the first channel layer, forming a protective layer on exposed portions of the replacement gate within the first trench; and
    prior to epitaxially growing the second channel layer, forming a protective layer on exposed portions of the replacement gate within the second trench.

4. The method of claim 1 further comprising:
    forming a first drain region and second drain region on the first and second portions of the first and second channel layers, respectively.

5. The method of claim 4 further comprising:
    removing a portion of the replacement gate.

6. The method of claim 5 further comprising:
    forming a protective block mask surrounding the second channel layer.

7. The method of claim 6 further comprising:
    forming a metal gate structure on and in contact with the exposed sidewalls of the first channel layer.

8. The method of claim 7 further comprising:
    depositing a metal gate fill material in the first region of the semiconductor structure.

9. The method of claim 8 further comprising:
    depositing a metal gate fill material in the first region of the semiconductor structure.

10. The method of claim 9 further comprising:
    removing the protective block mask surrounding the second channel layer; and removing the protective layers on the replacement gate within the second trench.

11. The method of claim 10 further comprising:
    epitaxially growing a second diode region in the second region wherein the second diode region surrounds the second channel layer; and
    wherein the second diode region comprises a material that has the opposite doping of the material of the second channel layer.

12. The method of claim 11 further comprising:
    prior to epitaxially growing the second diode region, removing the second spacer layer from the second region.

* * * * *